(12) United States Patent
Slafer

(10) Patent No.: US 10,546,722 B2
(45) Date of Patent: Jan. 28, 2020

(54) ROLL-TO-ROLL PATTERNING OF TRANSPARENT AND METALLIC LAYERS

(71) Applicant: Microcontinuum, Inc., Cambridge, MA (US)

(72) Inventor: W. Dennis Slafer, Arlington, MA (US)

(73) Assignee: MicroContinuum, Inc., Cambridge, MA (US)

(*) Notice: Subject to any disclaimer, the term of this patent is extended or adjusted under 35 U.S.C. 154(b) by 182 days.

(21) Appl. No.: 15/090,265

(22) Filed: Apr. 4, 2016

(65) Prior Publication Data

US 2016/0284515 A1    Sep. 29, 2016

Related U.S. Application Data

(60) Division of application No. 12/358,964, filed on Jan. 23, 2009, now Pat. No. 9,307,648, which is a
(Continued)

(51) Int. Cl.
*H01J 37/32* (2006.01)
*H05K 1/03* (2006.01)
(Continued)

(52) U.S. Cl.
CPC ........ *H01J 37/32009* (2013.01); *B82Y 10/00* (2013.01); *B82Y 40/00* (2013.01);
(Continued)

(58) Field of Classification Search
CPC .......... H01J 37/32009; H01J 2237/334; B29C 2035/0827; H05K 2203/0108;
(Continued)

(56) References Cited

U.S. PATENT DOCUMENTS 2,706,175 A    4/1955  Licharz
3,551,235 A   12/1970  Bassemir et al.
(Continued)

FOREIGN PATENT DOCUMENTS

CA    2504369    4/2003
DE    2708039    4/1979
(Continued)

OTHER PUBLICATIONS

Land, "An Introduction to Polavision," Photographic Science and Engineering, 21:225-236 (1977).
(Continued)

*Primary Examiner* — Philip C Tucker
*Assistant Examiner* — Vicki Wu
(74) *Attorney, Agent, or Firm* — Cesari and McKenna, LLP

(57) ABSTRACT

Systems and methods are disclosed by which patterns of various materials can be formed on flexible substrates by a continuous roll-to-roll manufacturing process. The patterns may include metallic, transparent conductive, or non-metallic elements with lateral dimensions including in the range from below 100 nanometers to millimeters and with thickness dimensions including the range from tens of Angstroms to greater than 10,000 Angstroms. The substrate may be any material capable of sufficient flexibility for compatibility with roll-based processing equipment, including polymeric films, metallic foils, and thin glass, with polymeric films representing a particularly broad field of application. Methods may include the continuous roll-to-roll formation of a temporary polymeric structure with selected areas open to the underlying substrate, the continuous addition or subtraction of constituent materials, and the continuous removal, where necessary, of the polymeric structure and any excess material.

9 Claims, 23 Drawing Sheets

Related U.S. Application Data continuation-in-part of application No. 11/471,223, filed on Jun. 20, 2006, now Pat. No. 8,435,373, and a continuation-in-part of application No. 10/588,098, filed as application No. PCT/US2005/001858 on Jan. 21, 2005, now Pat. No. 9,307,648, said application No. 12/358,964 is a continuation-in-part of application No. 11/509,288, filed on Aug. 24, 2006, now Pat. No. 7,833,389, which is a continuation-in-part of application No. 11/337,013, filed on Jan. 20, 2006, now Pat. No. 7,674,103, said application No. 12/358,964 is a continuation-in-part of application No. 11/711,928, filed on Feb. 27, 2007, now Pat. No. 9,039,401, and a continuation-in-part of application No. 11/830,718, filed on Jul. 30, 2007, now Pat. No. 8,535,041.

(60) Provisional application No. 60/692,078, filed on Jun. 20, 2005, provisional application No. 60/537,847, filed on Jan. 21, 2004, provisional application No. 60/538,120, filed on Jan. 21, 2004, provisional application No. 60/777,138, filed on Feb. 27, 2006, provisional application No. 60/645,714, filed on Jan. 21, 2005, provisional application No. 60/777,203, filed on Feb. 27, 2007, provisional application No. 60/834,105, filed on Jul. 28, 2006, provisional application No. 61/022,882, filed on Jan. 23, 2008, provisional application No. 61/028,650, filed on Feb. 14, 2008.

(51) Int. Cl.

| | | |
|---|---|---|
| *H05K 3/06* | (2006.01) | |
| *G03F 7/20* | (2006.01) | |
| *H05K 3/14* | (2006.01) | |
| *H05K 3/00* | (2006.01) | |
| *H05K 1/09* | (2006.01) | |
| *C23C 18/16* | (2006.01) | |
| *H01L 51/00* | (2006.01) | |
| *H05K 3/10* | (2006.01) | |
| *B82Y 10/00* | (2011.01) | |
| *B82Y 40/00* | (2011.01) | |
| *G03F 7/00* | (2006.01) | |
| *C25D 1/00* | (2006.01) | |
| *C25D 5/02* | (2006.01) | |
| *B29C 35/08* | (2006.01) | |
| *B05D 1/28* | (2006.01) | |
| *B05D 1/32* | (2006.01) | |
| *B05D 1/40* | (2006.01) | |
| *H01L 51/52* | (2006.01) | |

(52) U.S. Cl.
CPC .......... *C23C 18/1605* (2013.01); *C25D 1/003* (2013.01); *C25D 5/022* (2013.01); *G03F 7/0002* (2013.01); *G03F 7/20* (2013.01); *H01L 51/0023* (2013.01); *H05K 1/0393* (2013.01); *H05K 1/09* (2013.01); *H05K 3/0079* (2013.01); *H05K 3/061* (2013.01); *H05K 3/108* (2013.01); *H05K 3/143* (2013.01); *B05D 1/28* (2013.01); *B05D 1/32* (2013.01); *B05D 1/40* (2013.01); *B05D 2252/02* (2013.01); *B29C 2035/0827* (2013.01); *H01J 2237/334* (2013.01); *H01L 51/5206* (2013.01); *H01L 51/5234* (2013.01); *H01L 2251/301* (2013.01); *H01L 2251/308* (2013.01); *H01L 2251/5338* (2013.01); *H05K 2201/0326* (2013.01); *H05K 2203/0108* (2013.01); *H05K 2203/0113* (2013.01); *H05K 2203/0143* (2013.01); *H05K 2203/0264* (2013.01); *H05K 2203/1545* (2013.01)

(58) Field of Classification Search
CPC ...... H05K 1/0393; H05K 3/061; H05K 3/108; H05K 3/143; H05K 2203/0113; H05K 2203/0143; H05K 2203/1545; H05K 1/09; H05K 2201/0326; B05D 1/28; B05D 1/32; B05D 1/40; B05D 2252/02; B82Y 10/00; B82Y 40/00; G03F 7/0002; G03F 7/20; H01L 51/0023; H01L 51/5206; H01L 51/5234; H01L 2251/301; H01L 2251/308; H01L 2251/5338; H02K 2203/0264; C25D 1/003; C25D 5/022; C23C 18/1605
USPC ........................................................ 156/245
See application file for complete search history.

(56) References Cited

U.S. PATENT DOCUMENTS

| | | |
|---|---|---|
| 3,617,351 A | 11/1971 | Long et al. |
| 3,636,147 A | 1/1972 | Rowland et al. |
| 3,926,402 A | 12/1975 | Heenan |
| 4,042,654 A | 8/1977 | Leszyk et al. |
| 4,049,413 A | 9/1977 | George |
| 4,152,447 A | 5/1979 | Bachert |
| 4,181,217 A | 1/1980 | Huls et al. |
| 4,211,743 A | 7/1980 | Nauta et al. |
| 4,286,860 A * | 9/1981 | Gursky ............... G03F 7/3042 156/345.22 |
| 4,294,782 A | 10/1981 | Froehlig |
| 4,309,455 A | 1/1982 | Miyagawa |
| 4,362,806 A | 12/1982 | Whitmore |
| 4,366,235 A | 12/1982 | Land |
| 4,372,829 A | 2/1983 | Cox |
| 4,386,145 A | 5/1983 | Gilmour |
| 4,426,311 A | 1/1984 | Vander May |
| 4,428,761 A | 1/1984 | Howard et al. |
| 4,478,769 A | 10/1984 | Pricone et al. |
| 4,486,363 A | 12/1984 | Pricone et al. |
| 4,514,345 A | 4/1985 | Johnson et al. |
| 4,663,274 A | 5/1987 | Slafer et al. |
| 4,702,792 A * | 10/1987 | Chow ............... H01L 21/3212 257/E21.23 |
| 4,790,893 A | 12/1988 | Watkins |
| 4,836,874 A | 6/1989 | Foster |
| 4,871,623 A | 10/1989 | Hoopman et al. |
| 4,923,572 A | 5/1990 | Watkins et al. |
| 5,077,181 A | 12/1991 | Pan et al. |
| 5,096,401 A | 3/1992 | Tamura et al. |
| 5,147,763 A | 9/1992 | Kamitakahara |
| 5,281,371 A | 1/1994 | Tamura et al. |
| 5,284,548 A * | 2/1994 | Carey ............... H05K 3/427 216/105 |
| 5,327,825 A | 7/1994 | Parker |
| 5,330,880 A | 7/1994 | Horigome et al. |
| 5,358,283 A | 10/1994 | Silva |
| 5,408,308 A | 4/1995 | Allegretto et al. |
| 5,475,660 A | 12/1995 | Shikichi |
| 5,480,596 A | 1/1996 | Okubo et al. |
| 5,496,463 A | 3/1996 | Mori et al. |
| 5,502,564 A * | 3/1996 | Ledger ............... G01B 11/06 356/503 |
| 5,517,338 A | 5/1996 | Vaughn et al. |
| 5,521,030 A | 5/1996 | McGrew |
| 5,524,342 A | 6/1996 | Swain et al. |
| 5,575,961 A | 11/1996 | Kuwabara et al. |
| 5,620,712 A | 4/1997 | Nishino et al. |
| 5,620,769 A | 4/1997 | Wessels et al. |
| 5,627,817 A | 5/1997 | Rosen et al. |
| 5,635,114 A | 6/1997 | Hong |
| 5,639,404 A | 6/1997 | Meier-Kaiser et al. |
| 5,759,455 A | 6/1998 | Kamitakahara et al. |

(56) References Cited

U.S. PATENT DOCUMENTS

| | | |
|---|---|---|
| 5,759,468 A | 6/1998 | Smith et al. |
| 5,872,758 A | 2/1999 | Put et al. |
| 5,874,363 A | 2/1999 | Hoh et al. |
| 5,879,855 A | 3/1999 | Schadeli et al. |
| 5,906,912 A * | 5/1999 | Watanabe ............... G03F 7/093 216/67 |
| 5,948,488 A | 9/1999 | Marecki et al. |
| 6,015,599 A | 1/2000 | Keller et al. |
| 6,017,657 A | 1/2000 | Mentz et al. |
| 6,045,980 A | 4/2000 | Edelkind et al. |
| 6,106,627 A | 8/2000 | Yializis |
| 6,113,769 A | 9/2000 | Uzoh et al. |
| 6,162,519 A | 12/2000 | Takakuwa et al. |
| 6,163,523 A | 12/2000 | Drecoll |
| 6,183,610 B1 | 2/2001 | Kataoka et al. |
| 6,222,157 B1 | 4/2001 | Langille et al. |
| 6,241,228 B1 | 6/2001 | Chupick |
| 6,258,251 B1 | 7/2001 | Gowans et al. |
| 6,309,799 B1 | 10/2001 | Rueckl |
| 6,337,105 B1 | 1/2002 | Kunieda et al. |
| 6,375,870 B1 | 4/2002 | Visovsky et al. |
| 6,395,136 B1 | 5/2002 | Andersson et al. |
| 6,420,100 B1 | 7/2002 | Trokhan et al. |
| 6,440,333 B2 | 8/2002 | Masuhara |
| 6,482,742 B1 | 11/2002 | Chou |
| 6,540,367 B1 | 4/2003 | Benson et al. |
| 6,551,410 B2 | 4/2003 | Crevasse et al. |
| 6,554,601 B2 | 4/2003 | Ampulski et al. |
| 6,568,931 B2 | 5/2003 | Fujii et al. |
| 6,696,220 B2 | 2/2004 | Bailey et al. |
| 6,703,095 B2 | 3/2004 | Busshoff et al. |
| 6,753,067 B2 | 6/2004 | Chen et al. |
| 6,788,452 B2 | 9/2004 | Liang et al. |
| 6,790,377 B1 | 9/2004 | Cohen |
| 6,833,177 B2 | 12/2004 | Chen et al. |
| 6,849,308 B1 * | 2/2005 | Speakman ............... G03F 7/16 427/422 |
| 6,873,452 B2 | 3/2005 | Tseng et al. |
| 6,875,384 B1 | 4/2005 | Whitney |
| 6,906,779 B2 | 6/2005 | Chan-Park et al. |
| 6,933,098 B2 | 8/2005 | Chan-Park et al. |
| 6,972,893 B2 | 12/2005 | Chen et al. |
| 7,005,468 B2 | 2/2006 | Zang et al. |
| 7,109,118 B2 * | 9/2006 | Cohen .................... C25D 5/022 438/697 |
| 7,132,158 B2 | 11/2006 | Brenneman et al. |
| 7,144,942 B2 | 12/2006 | Zang et al. |
| 7,309,222 B2 | 12/2007 | Tippmann, Sr. |
| 7,674,103 B2 | 3/2010 | Slafer |
| 7,811,669 B2 * | 10/2010 | Fujii ................... C23C 14/0021 427/255.18 |
| 7,833,389 B1 | 11/2010 | Slafer |
| 8,435,373 B2 * | 5/2013 | Slafer ..................... B05D 1/28 156/209 |
| 8,535,041 B2 | 9/2013 | Slafer |
| 9,039,401 B2 | 5/2015 | Slafer |
| 9,307,648 B2 * | 4/2016 | Slafer ............... H01J 37/32009 |
| 2001/0038072 A1 | 11/2001 | Aumond et al. |
| 2001/0038900 A1 | 11/2001 | Todori et al. |
| 2002/0100553 A1 | 8/2002 | Toyoda |
| 2002/0186472 A1 | 12/2002 | Sloot |
| 2003/0059578 A1 * | 3/2003 | Williams ................ B05D 1/40 428/172 |
| 2003/0108710 A1 | 6/2003 | Coyle et al. |
| 2003/0227683 A1 | 12/2003 | Sewall et al. |
| 2004/0005423 A1 | 1/2004 | Dalton et al. |
| 2004/0075396 A1 * | 4/2004 | Okumura .......... H01J 37/32082 315/169.3 |
| 2004/0131718 A1 | 7/2004 | Chou et al. |
| 2004/0175528 A1 | 9/2004 | Paulson et al. |
| 2004/0219246 A1 | 11/2004 | Jeans |
| 2004/0266207 A1 | 12/2004 | Sirringhauss et al. |
| 2005/0032375 A1 * | 2/2005 | Lockard ................ C25D 5/022 438/689 |
| 2005/0069480 A1 | 3/2005 | Huang et al. |
| 2005/0112472 A1 | 5/2005 | Kutsch et al. |
| 2005/0133954 A1 | 6/2005 | Homola |
| 2005/0150589 A1 | 7/2005 | Amos et al. |
| 2005/0167276 A1 | 8/2005 | Stilli |
| 2005/0239935 A1 | 10/2005 | Kang et al. |
| 2005/0274693 A1 | 12/2005 | Heidari et al. |
| 2006/0134922 A1 | 6/2006 | Taussig et al. |
| 2006/0198981 A1 | 9/2006 | Murata et al. |
| 2006/0283539 A1 | 12/2006 | Slafer |
| 2007/0022096 A1 | 9/2007 | Slafer |
| 2008/0261478 A1 | 10/2008 | Cok et al. |

FOREIGN PATENT DOCUMENTS

| | | | |
|---|---|---|---|
| EP | 0264341 | 4/1988 | |
| EP | 0557998 | 9/1993 | |
| EP | 0762721 | 3/1997 | |
| EP | 0889306 | 1/1999 | |
| EP | 0889366 | 1/1999 | |
| EP | 1093901 | 4/2001 | |
| GB | 2350321 A * | 11/2000 | ............... G03F 7/16 |
| JP | 57143484 | 9/1982 | |
| JP | 60047846 | 3/1985 | |
| KR | 616105 | 8/2006 | |
| WO | WO199006234 | 6/1990 | |
| WO | WO 97/14142 | 4/1997 | |
| WO | WO 03/095175 | 11/2003 | |
| WO | WO 2004/101855 | 11/2004 | |
| WO | WO05/072242 | 8/2005 | |
| WO | WO05/072936 | 8/2005 | |
| WO | WO2006078918 | 7/2006 | |

OTHER PUBLICATIONS

International Search Report and Written Opinion received in corresponding PCT Application PCT/US07/076708.
Supplementary EP Search Report from Corresponding EP Application No. 06719038.
Definition of Lathe, from Answers.com; 2009.
International Search Report and Written Opinion from related PCT Application No. PCT/US2009/31876, 7 pages.
European Search Report from corresponding EP application No. 06773532.4 dated Apr. 8, 2011, 6 pages.
James. J. Cowan, et al., "The Recordings and Replication of Holographic Micropatterns for the Ordering of Photographic Emulsion Grains in Film Systems." J. Imaging Sci. 31, 100-107 (1987).
Slafer et al. "Investigation of Arrayed Silver Halide Grains" J. Imaging Sci. 31, 117-125 (1987).
Walworth et al. "Thin Layer Coalescence of Silver Halides" J. Imaging Sci. 31, 108-116 (1987).
Sachin Bet et al. "Thin film deposition on plastic substrates using silicon nanoparticles and laser nanoforming" Materials Science and Engineering B. vol. 130. Issues 1-3, Jun. 15, 2006 pp. 228-236.
International Search Report and Written Opinion from related PCT Application No. PCT/US2007/74766, 10 pps.
International Search Report and Written Opinion from related PCT Application No. PCT/US2007/05151, Feb. 1. 2018, 12 pages.
Slafer, "Continuous Manufacturing of Thin Cover Sheet Optical Media" SPIE Optical Data Storage, 14, pages. (1992).
Alleman, Gayle "How DVDs Work" Oct. 25, 2000. Howstuffworks.com http://electronics.howstuffworks.com/dvd.htm.
Supplementary European Search Report for related EP Application No. EP04711734, 2 pps.

\* cited by examiner

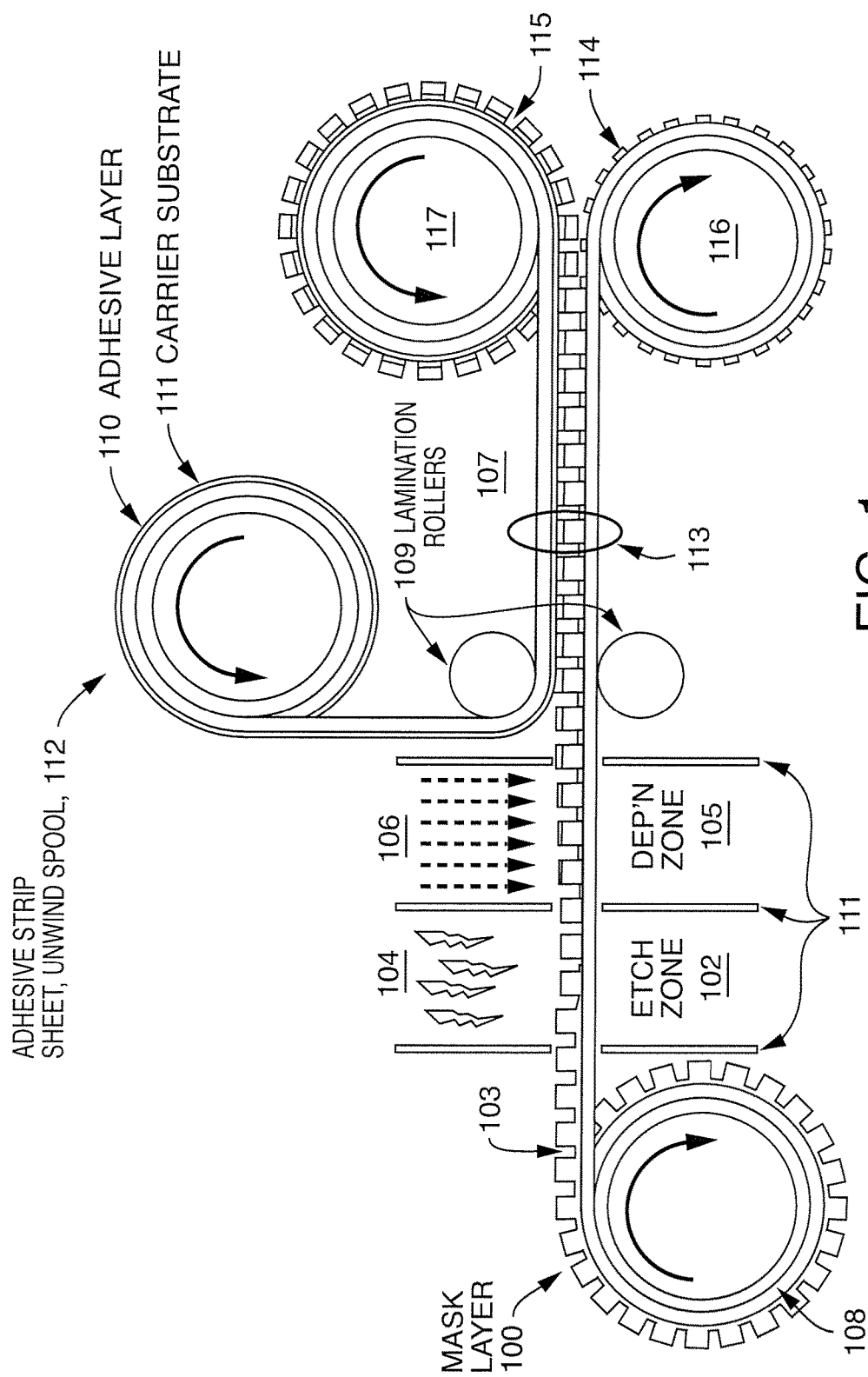

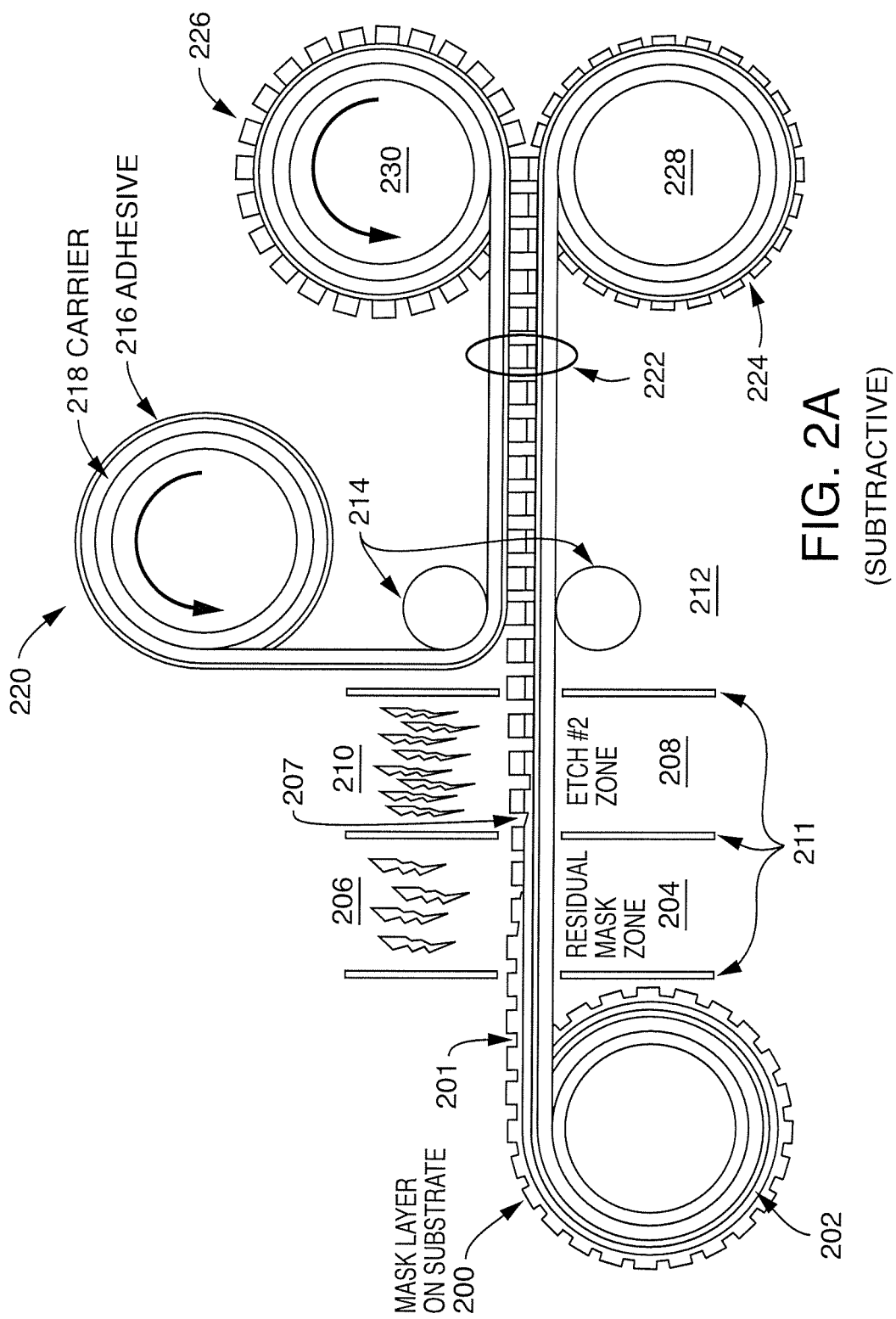
FIG. 2A (SUBTRACTIVE)

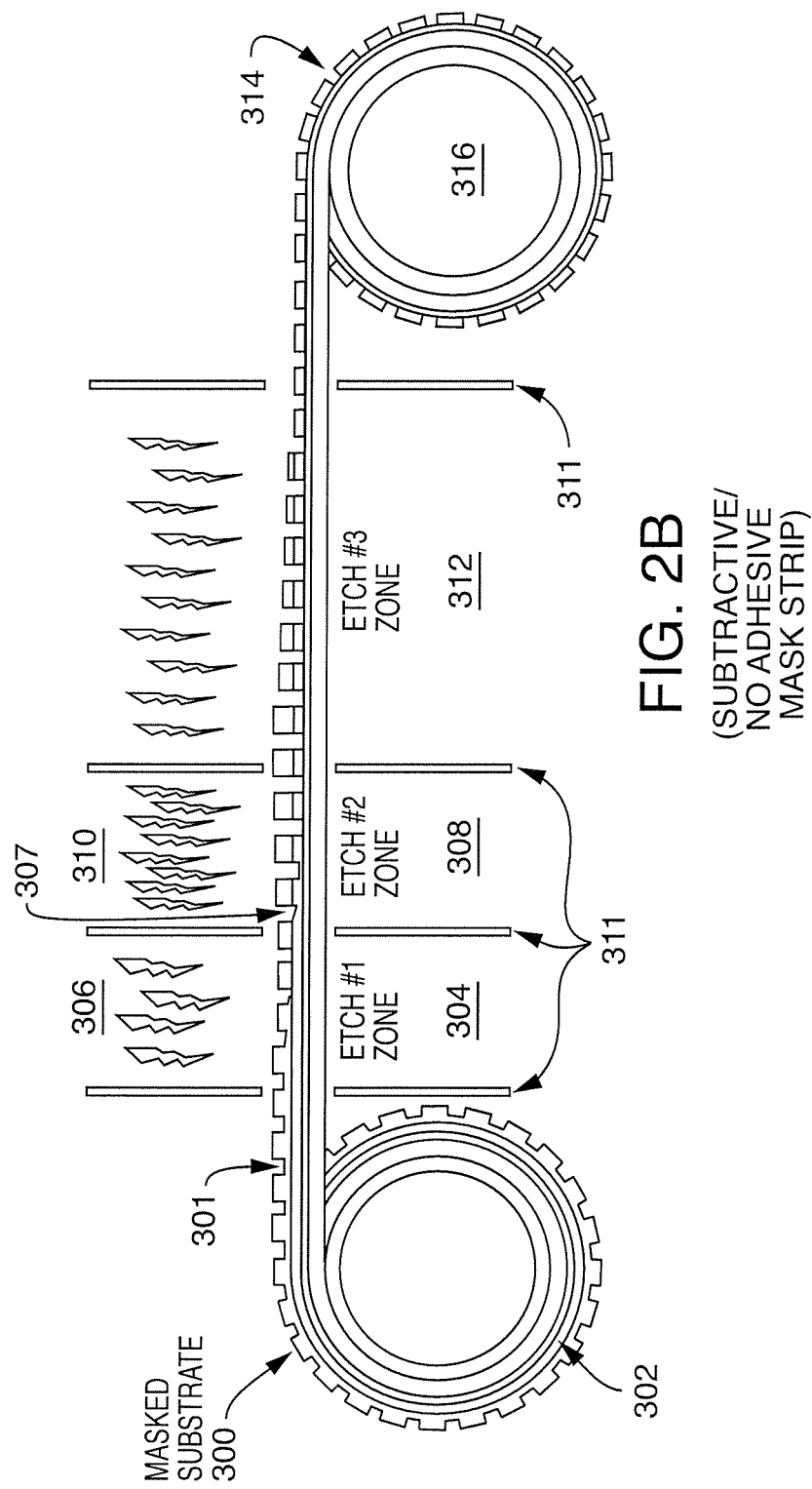

(SUBTRACTIVE-ADDITIVE)

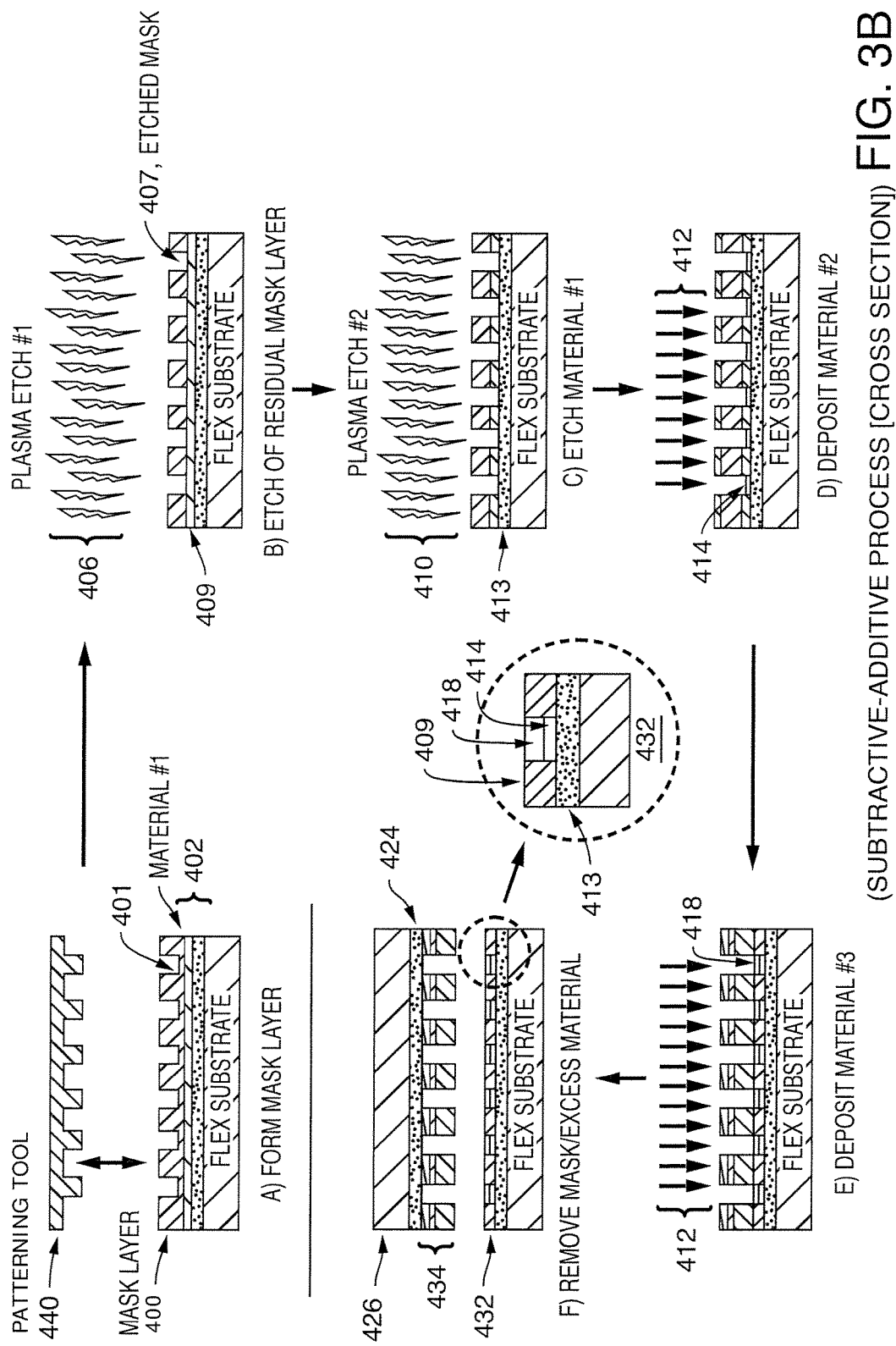
FIG. 3B (SUBTRACTIVE-ADDITIVE PROCESS [CROSS SECTION])

(MASK TRANSFER)

(CONTINUOUS R2R APPARATUS FOR FORMING MASK LAYER)

(CONTINUOUS R2R APPARATUS FOR FORMING MASK LAYER USING TRANSPARENT ROTARY PATTERNING TOOL)

(TANDEM R2R PROCESS FOR MASK PATTERN FORMATION AND ETCHING)

(PATTERNING PROCESS WITHOUT ETCHING)

PRESSURE SENSITIVE ADHESIVE

LIQUID ADHESIVE

SOLVENT REMOVAL

ETCH RESIDUAL POLYMER

POLYMER MASK

RELEASED MASK (MASKLESS PATTERNING [AL ON PET])

(HIGH TRANSMISSION GRID)

| LENGTH (μm) | LINE WIDTH (μm) | OPEN AREA | RATIO W/L | (@90% SUB) |
|---|---|---|---|---|
| 125 | 40 | 66.5% | 32.0% | 59.9% |
| 125 | 20 | 82.4% | 16.0% | 74.2% |
| 125 | 10 | 91.0% | 8.0% | 81.9% |
| 250 | 40 | 82.4% | 16.0% | 74.1% |
| 250 | 20 | 91.0% | 8.0% | 81.9% |
| 250 | 10 | 95.4% | 4.0% | 85.9% |
| 500 | 40 | 91.0% | 8.0% | 81.9% |
| 500 | 20 | 95.4% | 4.0% | 85.9% |
| 500 | 10 | 97.7% | 2.0% | 87.9% |

(OPTICAL TRANSMISSION OF VARIOUS GRID PATTERNS)

(USE OF FRINGES FOR METROLOGY
AND PROCESS CONTROL)

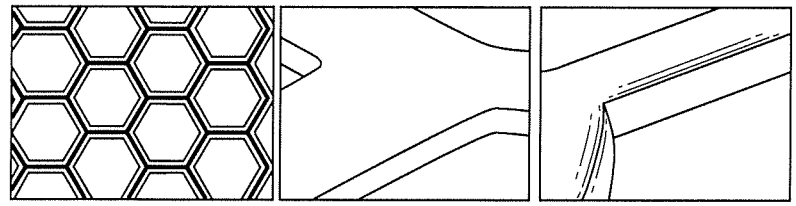
FIG. 14A (SEMs OF SUBTRACTIVE MASK)
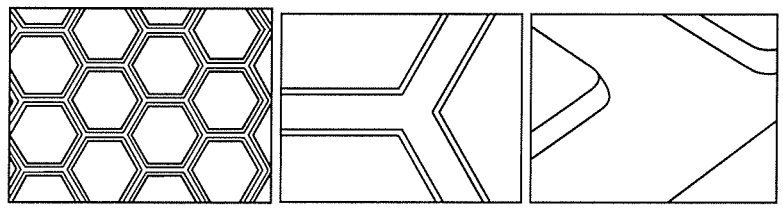
FIG. 14B (SEMs OF ADDITIVE MASK)
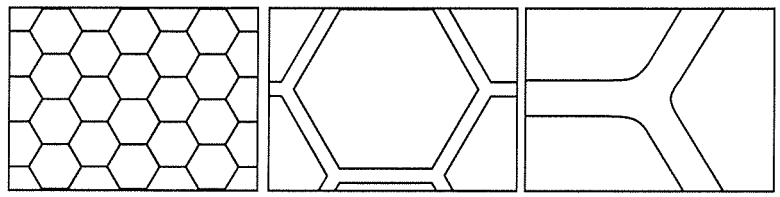
FIG. 15A (MICROGRAPH OF PLASMA ETCHED ITO)
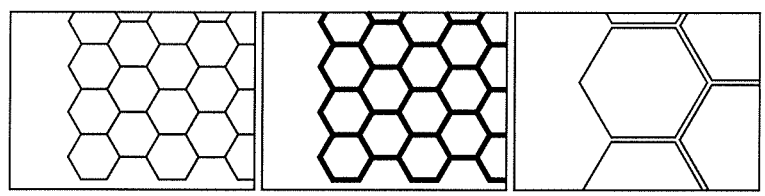
FIG. 15B (MICROGRAPH OF PLASMA ETCHED Ti)
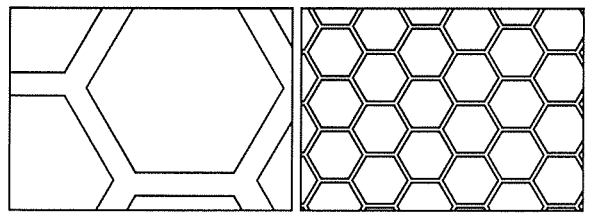
FIG. 15C (MICROGRAPH OF CHEMICAL ETCHED Ti)

(WET ETCH OF THICK ALLOY LAYER ON THIN KAPTON)

(DIGITAL SCAN OF AL PATTERN [WET ETCH])

(OPTICAL MICROGRAPHS OF GOLD AFTER LIFTOFF AND [INADVERTENT] REDEPOSITION)

(SEM OF Ti WIRE LOOPS MADE BY SUBTRACTIVE PROCESS [EACH LOOP IS 3.5 μm ON SIDE AND 100 μm THICK])

(OVERETCHED ALLUMIUM
[POLYMER IN PLACE])

(SUBTRACTIVE [THROUGH TOOL] PROCESS WITH
WET ETCHING SHOWING CONTROLLED OVERETCH)

(REDUCED POLYMER RESIDUE RESULTS)

ROLL-TO-ROLL PATTERNING OF TRANSPARENT AND METALLIC LAYERS

RELATED APPLICATIONS

This application is a divisional of (MCMK-7CP) U.S. patent application Ser. No. 12/358,964 filed 23 Jan. 2009 and entitled "ROLL-TO-ROLL PATTERNING OF TRANSPARENT AND METALLIC LAYERS," which is a continuation-in-part of (MCMK-7) U.S. patent application Ser. No. 11/471,223 filed 20 Jun. 2006 and entitled "Systems and Methods for Roll-to-Roll Patterning," which claims the benefit of U.S. Provisional Patent Application No. 60/692,078 filed 20 Jun. 2005; this application is a continuation-in-part of (MCMK-4) U.S. patent application Ser. No. 10/588,098 having a § 371(c) filing date of 18 Dec. 2006 and entitled "Apparatus and Method for Manufacturing Preformatted Linear Optical Storage Medium," which is a national phase application of International Patent Application No. PCT/US05/01856 filed 21 Jan. 2005, which claims the benefit of U.S. Provisional Patent Application No. 60/537,847 filed 21 Jan. 2004 and U.S. Provisional Patent Application No. 60/538,120 filed 21 Jan. 2004; this application is a continuation-in-part of (MCMK-5CP) U.S. patent application Ser. No. 11/509,288 filed 24 Aug. 2006 and entitled "Replication Tools and Related Fabrication Methods and Apparatus," which (i) claims the benefit of (MCMK-10PR) U.S. Provisional Patent Application No. 60/777,138 filed 27 Feb. 2006 and (ii) is a continuation-in-part of (MCMK-5) U.S. patent application Ser. No. 11/337,013 filed 20 Jan. 2006 and entitled "Replication Tools and Related Fabrication Methods and Apparatus," which claims the benefit of U.S. Provisional Patent Application No. 60/645,714 filed 21 Jan. 2005; this application is a continuation-in-part of (MCMK-9) U.S. patent application Ser. No. 11/711,928 filed 27 Feb. 2007 and entitled "Formation of Pattern Replicating Tools," which claims the benefit of U.S. Provisional Patent Application No. 60/777,203 filed 27 Feb. 2007; this application is a continuation-in-part of (MCMK-11) U.S. patent application Ser. No. 11/830,718 filed 30 Jul. 2007 and entitled "Addressable Flexible Patterns," which claims the benefit of U.S. Provisional Patent Application No. 60/834,105 filed 28 Jul. 2006; the entire contents of all of which applications are incorporated herein by reference.

This application claims the benefit of (MCMK-13PR) U.S. Provisional Patent Application No. 61/022,882 filed 23 Jan. 2008 and entitled "Roll-to-Roll Patterning of Transparent and Metallic Conductors"; this application also claims the benefit of (MCMK-8BPR) U.S. Provisional Patent Application No. 61/028,650 filed 14 Feb. 2008 and entitled "Patterning Through UV-Blocking Substrates"; the entire contents of both of which applications are incorporated herein by reference.

BACKGROUND

Conventional approaches to creating micro- and nanoscale patterns used in the semiconductor, and other industries are based on processing of substrates using optical lithography and photoresist technology in by batch processing techniques (e.g., as discrete units), generally using rigid (silicon, glass, quartz, etc.) substrates. Such patterning techniques have also, under a somewhat more limited set of conditions, been extended to flexible substrates. The conventional batch processes are well suited to ultra-high resolution/high-density devices on rigid substrates but are less than optimal for use with devices requiring large substrates, high throughputs and/or very low cost manufacturing. The precision patterns produced by semiconductor lithography processes typically require very uniform spin coating of a solvent-based resist, careful pre-baking, optical mask exposure, resist developing (wet or dry), rinsing and drying of the resist prior to vacuum deposition or etching. The mask is removed by a wet or dry stripping or etching, followed by rinsing and drying. And as required features become smaller and smaller, the exposure sources require shorter wavelengths with increasing more complex and expensive optics.

SUMMARY

Systems, methods, and apparatus are disclosed by which precise patterns of various materials can be formed on flexible substrates by a continuous roll-to-roll ("R2R") manufacturing process. The patterns may consist of metallic, transparent conductive, non-metallic, dielectric, etc. elements. In exemplary embodiments, such elements can have lateral dimensions ranging from less than 100 nanometers to millimeters and with thickness dimensions ranging from several nanometers to greater than, e.g., 10,000 nanometers. The substrate may consist of any material capable of sufficient flexibility for compatibility with roll-based processing equipment, including but not limited to polymeric films, metallic foils, and composites, with polymeric films representing a particularly broad field of application.

Exemplary embodiments described herein may differ in the detailed features of the patterns and how and where they are formed. Preferred embodiment, however, may generally include: (1) the fabrication of a durable cylindrical tool with which to produce a relief pattern, starting with a planar master pattern; (2) using the tool in a R2R process to continuously replicate the tool pattern into a polymeric layer; (3) using the pattern to define selected areas as open to the underlying substrate; (4) continuous R2R addition or removal of constituent material; and (5) continuous removal of the polymeric structure to create the desired pattern.

According to exemplary embodiments, methods used to produce these patterns may include continuous roll-to-roll formation of a temporary three-dimensional polymeric structure, processing the structure to form a sharp relief mask with selected areas open to the underlying substrate, continuous addition or removal of pattern materials, and the continuous removal of the polymeric relief mask structure along with any excess material.

Several embodiments are described, each of which overcomes one or more of the limitations of the prior batch or roll-based processing techniques by enabling precision patterning to be carried out on continuous roll-to-roll equipment at lower costs, in higher production volumes, and over larger areas. The systems, methods, and apparatus of this invention can be applied to the manufacture of many devices, including video displays, flexible electronics, grid arrays, addressable microstructures, light control elements, to name a few.

BRIEF DESCRIPTION OF THE DRAWINGS

Various aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 1 depicts a Roll-to-roll (R2R) process/apparatus for forming desired pattern on flexible substrate by addition of material.

FIG. 2A depicts a roll-to-roll (R2R) process/apparatus for forming desired pattern on flexible substrate by removal of material.

FIG. 2B depicts another embodiment of roll-to-roll (R2R) process/apparatus for forming desired pattern on flexible substrate by removal of material.

FIG. 3B depicts a cross-sectional view of the process/apparatus of FIG. 3A, where the numbers have the same reference as those in FIG. 3A.

FIGS. 14A and 14B depicts scanning electron microscope ("SEM") views of subtractive and additive masks, respectively, in accordance with exemplary embodiments of the present disclosure;

FIGS. 15A-15E depict micrographs of etched layers of different materials, in accordance with exemplary embodiments of the present disclosure;

Figure 3A:
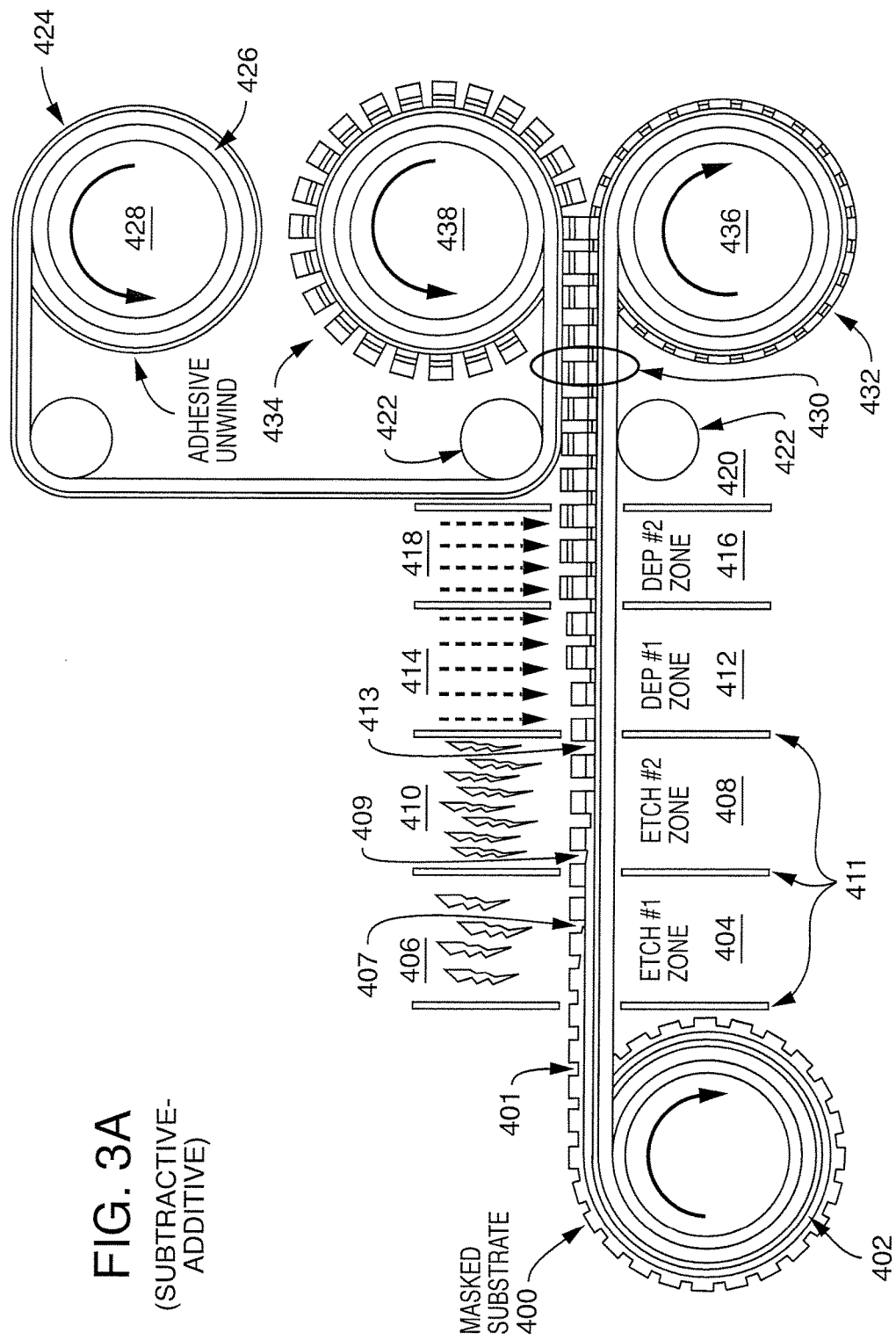
FIG. 3A depicts a roll-to-roll (R2R) process/apparatus for forming desired pattern on flexible substrate by removal and addition of material.

It should be understood by one skilled in the art that the embodiments depicted in the drawings are illustrative and variations of those shown as well as other embodiments described herein may be envisioned and practiced within the scope of the disclosure.

DETAILED DESCRIPTION

An aspect of the present disclosure is directed to continuous roll-to-roll processes for forming a desired pattern in a material layer on a flexible substrate. A general method can include the formation of an in situ three-dimensional polymeric relief structure ('in situ mask', or ISM) on an upper material layer, processing the structure to form a sharp relief mask with selected areas open to the underlying material layer, continuous removal of exposed material or addition of new material, followed by continuous removal of the polymeric relief structure plus any excess material. In the following descriptions, the polymeric relief structure generally refers to the 3-D form of a solidified organic material molded from a template of complementary form and may range from a simple acrylic polymer to a more complex photocurable multi-component composition (incorporating monomers, cross-linking and sensitizing agents, etc.).

Methods for improving and optimizing each of the process steps are given, and alternative approaches are also described, with the overall goal of improving the efficiency and reducing the cost of the manufacturing process, without sacrificing the resolution capability of the process.

An embodiment of a method according to the present disclosure can include first the generation of a master pattern, which is a three dimensional representation (i.e., a relief pattern) of the desired pattern and which can be formed by any of a number of techniques well know to the art (optical lithography, e-beam or laser writing, holography, etc.). The relief pattern is then converted into a durable precision rotary forming an embossing tool for continuous pattern replication, for example as taught in Applicant's co-owned and co-pending U.S. application Ser. No. 11/337,013, filed 20 Jan. 2006, entitled "Replication Tools and Related Fabrication Methods and Apparatus," the contents of both of which are incorporated in their entirety herein by reference. Such rotary tools may be characterized by having either a minimal seam or no physical seam. Such tools may also have a predetermined pattern with precisely formed features and well-controlled or suitable top, sidewall, and bottom critical dimensions.

The master pattern may be a positive or negative (i.e., complementary) image relative to the desired pattern, since a copy or replica of the original pattern can be used to reverse the pattern symmetry, a technique well know to the art. The patterning tool can made by Ni electroforming or other metal deposition (e.g., electroplating or electroless) techniques, or radiation curing of a polymer material, or by direct etching or writing, for example as described in Applicant's referenced co-pending applications.

The rotary tool can be used to continuously form the in situ mask ("ISM") on the flexible substrate. In exemplary embodiments, the ISM may be formed on the flexible substrate by processes described in Applicants co-pending PCT Application No. U.S. Ser. No. 05/001,864, filed 21 Jan. 2005 and entitled "Pre-Formatted Optical Data Storage Tape," and PCT application No. U.S. Ser. No. 05/001,856, filed 21 Jan. 2005 and entitled "Apparatus and Method For Manufacturing Pre-Formatted Linear Optical Data Storage Medium," the contents of both of which are incorporated herein in the entireties by reference. Other suitable techniques may be used to for form the ISM as well. The ISM itself may then processed to form a suitably sharp relief mask, such as by selective polymer dry etching to expose the underlying substrate. As used herein, the term "rotary" can include reference to a roughly cylindrical object or group of objects or a shape or collection of pieces connected end-to-end, like belt or drum; such a shape or shapes do not necessarily have to be round.

The underlying layer(s) or substrate exposed through the openings in the ISM may be removed by dry or wet etch means (also referred to herein as "subtractive" processing), or alternatively layers may be added by any of a number of deposition means, including vacuum, plating, ink jet, etc. (also referred to herein as "additive" processing). Additional layers underlying the ISM layer may also be beneficially added to enhance the specificity of the material removal process (i.e., etch stop layers). All of these processes are capable of being carried out by continuous R2R processing.

Although the ISM may be left in place for certain applications, it is generally removed after subtractive or additive processing. It is a method of this disclosure that the removal of the mask is carried out in a continuous manner which may be effected by any of several means, including mechanical, chemical, or dry etching. In the case of subtractive processing, after material removal has been completed, the ISM can be removed by selective dry etch processing. If the removal step has also been carried out by dry plasma etching, then all that is required to remove the ISM is a change of etchant gas, thus the material mask removal process can be carried out in a single vacuum operation, without need to 'break vacuum'.

In exemplary embodiments, material removal and material addition may be carried out in sequence using the same ISM such that one (or more) added materials may be coplanar with one (or more) etched underlying layers. For example, channels or traces in an $SiO_2$ layer may be defined by plasma etch removal of the $SiO_2$ that is exposed through the mask openings, followed by the vacuum deposition of a metal into the same channels. If the amount of the deposited metal is the same as the depth of the removed $SiO_2$, then upon mask removal the metal traces will be coplanar with the $SiO_2$ layer. This can be useful in the fabrication of TFTs, for example.

A variation on the metal rotary tool is the transparent drum pattern, which can be particularly useful in exemplary embodiments, e.g., when the ISM is formed by a radiation curing processes such as UV, e-beam polymerization, etc., on substrates that either do not intrinsically transmit such radiation or contain features, e.g., metallic layers, that do not transmit such radiation.

In the various embodiments of the present disclosure, the term substrate refers to a flexible carrier material, typically polymeric, such at PET, PEN, PMMA, polycarbonate, polyimide, polyethylene, etc. (although thin flexible metals are possible), that acts as a support for the desired pattern, herein referred to as the "receiving layer", or acts as a temporary support for the structured polymeric layer, referred to as the "donor layer". Some embodiments may include either or both types of layers. The substrate may also include one or more release or adhesive or etch stop layers under the ISM layer.

In Situ Mask Layer Formation

As described previously, the In Situ Mask (ISM) Layer can be made with numerous materials and by various techniques suitable for forming polymeric 3D relief patterns. In exemplary embodiments of this method, the specific combination of mask materials and substrate/coating layers can have specific (desired) relative adhesion strengths. The adhesion of the mask polymer to the tool is preferably be lower than the adhesion of the mask polymer to the substrate, which in turn must be lower than the adhesion between the mask polymer and the strip sheet used to remove the mask after use. For some embodiments, a permanent ISM pattern may be formed directly into the carrier substrate, such as in the case of polycarbonate, PMMA, or PE, to name a few).

The ISM material may also be a radiation (IR, UV, e-beam, etc.) curable formulation that is cured upon exposure to said radiation after the forming tool is placed in contact with the liquid formulation, such materials including acrylates, polyurethanes, etc. Further, the ISM polymer may be pre-coated on the substrate (or on layers over the substrate) and the mask pattern formed by the chemical or thermal softening of the layer with contact to the master pattern, where such materials may include any of polycarbonate, PMMA, cellulose actetate butyrate, styrene, PVA, gelatin, PVC, styrene acrylonitrile etc. In addition to polymeric materials, the relief pattern may also be formed in nanocomposite/binder materials (including green ceramics, etc.).

In exemplary embodiments, the in situ mask (ISM) layer can be formed continuously by molding from a rotary template, e.g., as described in Applicant's previously described co-owned and herein incorporated U.S. application Ser. Nos. 10/588,098, 11/509,288, 11/471,223, 11/711, 928, and 11/830,718. In one embodiment of this invention, a radiation-curable liquid polymeric material (such as NOA 81 and/or NOA 88 as made commercially available by Norland Products Inc., 2540 Route 130, Suite 100 Cranbury, N.J. 08512, USA Dymax 703 as made commercially available from DYMAX Corporation, 318 Industrial Lane, Torrington, Conn. 06790, USA) can be used to form the ISM layer, and this can be pre-coated onto the rotary tool, the incoming substrate, or both, by any of several known precision coating means suitable for continuous roll-to-roll application, such as gravure, slot, etc. The uniformity and precision of the pattern formed by the process described herein is improved by maintaining thickness and distribution ('coverage') uniformity of the polymeric material from which the ISM is formed. It is further advantageous to use a non-contact method of application in order to minimize contamination or defects, and ink jet application offers both a high degree of coating uniformity and non-contact application. Such devices are used in such industries as graphic arts and the manufacture of flat panel displays, etc (such as are made by Trident Industrial Inkjet, Brookfield Conn., or by Dimatix, Santa Clara Calif.).

A limitation in the ink jet application of radiation curable liquids such as the ISM polymers can be that their viscosity is often higher than that of the inks and fluids that the ink jet systems were designed for, and when this is the case the ink jet dispenser will not operate. Exemplary embodiments of the present disclosure enable the use of ink jet dispensers to apply a uniform fluid polymer layer by either raising the temperature of the fluid or by lowering the effective polymer fluid viscosity by the addition of a solvent or solvent blend, or both. For the first case, raising the temperature will lower the viscosity of most such fluids, which can be done either in the liquid reservoir or in the head itself. The viscosity can also be lowered by the addition of a miscible solvent or solvent blend (diluent) having a high vapor pressure than the polymer liquid, which allows the diluent to be "flashed off" once the droplets have left the nozzle or have been deposited on the substrate (where auxiliary heating can be used to further remove the diluent, as necessary.

Processing Conditions

The formation of the ISM layer may include one or more of the following processing variables: polymer radiation exposure (IR, UV, e-beam, etc.), exposure distribution and control (including multi-stage curing), chemical treatment, fluid distribution patterns of monomers, polymers and formulations, fluid rheology, processing fluids, substrate/tool temperature, etc. Mechanical variables include number and position of rotary engagement (nip) rolls, pressure of nip roll(s), durometer (hardness) and diameter and surface finish of nip roll(s), web speed, web tension, diameter, hardness, and position of nip rolls, etc. Other variables include patterning tool depth, polymer-tool contact dwell time, adhesion control (corona or plasma treatment, etc.), polymer removal materials, static electricity control.

An aspect common to all of the embodiments of this disclosure is the creation of a rotary patterning tool (also referred to interchangeably herein as a cylinder or drum) used in a continuous roll-to-roll machine as a means to form the ISM polymer layer, which in turn is used as a key element in the formation of the desired patterned flexible substrate. The outer surface of the patterning tool is generally a relief representation of the desired pattern, where the design for said pattern may be created as a computer design (CAD drawing, etc.), drawn artwork, electronic control circuit, etc. to be used to form an intermediate photomask or electronic signal which controls the exposure or writing process or instrument (laser, e-beam), all of which processes and techniques are well known to the art.

The initial relief representation of this design, which may be referred to as the "master" pattern, can be formed on the internal or external surface of the drum, either by near-seamless or true seamless methods, e.g., as described in Applicant's co-owned and co-pending U.S. application Ser. No. 11/337,013, filed 20 Jan. 2006, entitled "Replication Tools and Related Fabrication Methods and Apparatus."

It should be noted that either positive or negative pattern images can be created, by choice of the direct writing strategy and/or choice of positive- or negative-working photoresists. It is further a method of this disclosure to form a drum patterning tool by use of such techniques as selective metal etching (plasma or chemical), direct ablative writing, post-processing (crosslinking) of patterned photoresist, thermal or radiation-hardening techniques, ion implantation, or other suitable relief pattern-forming techniques.

FIG. 1 depicts a Roll-to-roll (R2R) process/apparatus for forming desired pattern on flexible substrate by addition of material. In FIG. 1, a roll of substrate containing a patterned mask layer having a relief representation of a desired pattern 100 is unwound and is directed into a first zone or region 102 in which any residual mask material 103 that exists at the lowest part of the relief pattern is removed by means of a plasma etch or chemical removal process 104. The masked film is then directed into a first deposition zone or region 105 wherein a material 106 is added by vacuum deposition, chemical vapor deposition, chemical deposition, electroplating, electroless deposition, etc. Although a single deposition zone is shown, additional zones may be used to deposit additional materials by the same or different such deposition means.

The mask film with deposited material(s) is then directed into a mask removal zone or region 107 wherein the mask layer plus any excess deposited materials is removed from the carrier substrate 108. In FIG. 1A, this is accomplished be lamination, using a pair of pressure lamination rollers 109, of a "strip sheet" comprising an adhesive layer 110 and a carrier substrate 110 supplied from a supply spool 112. The adhesive can be a pressure sensitive adhesive, heat activated adhesive, radiation cured adhesive, etc., where the pressure, heat, radiation, or any required adhesive fluid or component is supplied in zone 107. Upon delamination of the temporarily bonded adhesive-mask composite structure 113, the substrate containing the desired pattern 114 and strip sheet containing the mask material plus any excess deposited material 115 are rewound on spools 116 and 117, respectively.

Although not shown in FIG. 1, it should be noted that other means/ways/mechanisms of removing the mask material, such as solvent swelling or dissolution, etc. may be used in place of the adhesive-strip sheet process, where such processes may take place by lamination of a strip sheet with a solvent, chemical, or mixture, or by use of dip tanks to likewise remove the used mask layer and any excess added materials.

It should also be noted that the series of process steps described herein can be designed to be carried out in a single continuous roll-to-roll operation, or as a series of single or multiple R2R process steps, depending on compatibility of the various sequential process steps, machine complexity, cost factors, etc. For example, removal of residual mask pattern material by plasma etching followed by vacuum deposition of a desired material can both take place in a single vacuum roll coater, where the two zones could be differentially vacuum pumped to maintain optimal conditions (pressure, background gas, etc.), as needed, where 111 shows this separation of the various zones schematically. Depending on the process, the patterning operation and/or mask removal process can also be carried out in a vacuum roll coater, or, alternatively, one or more of the steps of patterning, chemical etching, and chemical deposition, and mask removal may be carried out in tandem in an atmospheric coater.

FIG. 2A depicts a roll-to-roll (R2R) process/apparatus for forming desired pattern on flexible substrate by removal of material. A roll of substrate containing a patterned mask layer having a relief representation of a desired pattern 200 coated over one (or more) material layers 202 is unwound and is directed into a first zone or region 204 in which any residual mask material 201 that exists at the lowest part of the relief pattern is removed by means of a plasma etch or chemical removal process 206. The aforementioned process zone may not be required in processes in which the mask layer is formed in such a way as to not have residual mask material requiring removal, as described elsewhere in this invention. The masked film with an underlying material layer exposed through the openings in the mask layer 207 is then directed into a material removal zone or region 208 wherein material from the material layer is selectively removed through the use of removal processes 210 such as plasma or chemical etching, etc. Although a single etching zone is shown, additional zones may be used to remove material by the same or different such removal means. Further, material layer(s) 202 may include multiple layers comprised of one or more materials to be removed, and may also include a layer whose removal rate is substantially lower than that of an overlying layer, said underlying layer acting as an "etch stop" to prevent further material removal.

The masked film with removed material(s) is then directed into a mask removal zone or region 212 wherein the mask layer is removed from the patterned substrate. In FIG. 2A, this is accomplished by lamination, through the use of a pair of pressure lamination rollers 214, of a "strip sheet" comprising an adhesive layer 216 and a carrier substrate 218 supplied from a supply spool 220. The adhesive can be a pressure sensitive adhesive, heat activated adhesive, radiation cured adhesive, etc., where the pressure, heat, radiation, or any required adhesive fluid or component is supplied in zone 212. Upon delamination of the temporarily bonded adhesive-mask composite structure 222, the substrate containing the desired pattern 224 and strip sheet containing the mask material 226 are rewound on spools 228 and 230, respectively.

Although not shown in FIG. 2A, it should be noted that other means of removing the mask material, such as solvent swelling or dissolution, etc. may be used in place of the adhesive-strip sheet process, where such processes may take place by lamination of a strip sheet with a solvent, chemical, or mixture, or by use of dip tanks to likewise remove the used mask layer and any excess added materials.

It should also be noted that the series of process steps described herein can be designed to be carried out in a single continuous roll-to-roll operation, or as a series of single or multiple R2R process steps, depending on compatibility of the various sequential process steps, machine complexity, cost factors, etc. For example, removal of residual mask pattern material by a first plasma etching process may be followed by a second etching process, where the etch conditions (gasses, carrier gas, power, etc.) of the zones may be different, which in turn may be followed by additional etch zones as needed, and where some or all of said processes may be carried out in a single continuous (vacuum) R2R process, as needed, where 211 shows the separation of the various process zones schematically.

Depending on the specific materials and requirements of the process, the patterning operation and/or mask removal process can also be carried out in a vacuum roll coater, or, alternatively, one or more of the steps of patterning, chemical etching, and mask removal may be carried out in tandem in an atmospheric coater.

FIG. 2B depicts another embodiment of roll-to-roll (R2R) process/apparatus for forming desired pattern on flexible substrate by removal of material. FIG. 2B shows a roll of substrate containing a patterned mask layer having a relief representation of a desired pattern 300 coated over one (or more) material layers 302 is unwound and is directed into a first zone or region 304 in which any residual mask material 301 that exists at the lowest part of the relief pattern is removed by means of a plasma etch or chemical removal process 306. The process zone may not be required in processes in which the mask layer is formed in such a way as to not have residual mask material requiring removal, as described elsewhere in this invention. The masked film with an underlying material layer exposed through the openings in the mask layer 307 is then directed into a material removal zone or region 308 wherein material from the material layer is selectively removed through the use of removal processes 310 such as plasma or chemical etching, etc. Although a single etching zone is shown, additional zones may be used to remove material by the same or different such removal means. Further, material layer(s) 302 may include multiple layers comprised of one or more materials to be removed, and may also include a layer whose removal rate is substantially lower than that of an overlying layer, said underlying layer acting as an "etch stop" to prevent further material removal.

In this embodiment, the masked film with removed material(s) is then directed into a mask removal zone 312 wherein the mask layer is removed from the patterned substrate without utilizing an adhesive-strip sheet. Here, this is accomplished by means of an etch process wherein the etch conditions are optimized for mask removal (such as 304 or other high-rate removal process). Separation of the various zones to allow isolation and optimization of the respective removal conditions is shown schematically by 311. Mask removal may also be accomplished by swelling or dissolution, etc., using a solvent, chemical, or mixture, or by use of dip tanks to likewise remove the used mask layer and any excess added materials. The substrate with the desired pattern 314 is rewound onto spool 316.

It should also be noted that the series of process steps described herein can be designed to take place in a single continuous roll-to-roll operation, or as a series of single or multiple R2R process steps, depending on compatibility of the various sequential process steps, machine complexity, cost factors, etc. For example, removal of residual mask pattern material by a first plasma etching process may be followed by a second etching process, where the etch conditions (gasses, carrier gas, power, etc.) of the zones may be different, which in turn is followed by additional etch zones as needed, and all said processes may be carried out in a single continuous (vacuum) R2R process.

Depending on the specific materials and requirements of the process, the patterning operation and/or mask removal process can also be carried out in a vacuum roll coater, or, alternatively, one or more of the steps of patterning, chemical etching, and mask removal may be carried out in tandem in an atmospheric coater.

FIG. 3 depicts a roll-to-roll (R2R) process/apparatus for forming desired pattern on flexible substrate by removal and addition of material. In FIG. 3, a roll of substrate containing a patterned mask layer having a relief representation of a desired pattern 400 coated over one (or more) material layers 402 is unwound and is directed into a first zone or region 404 in which any residual mask material 401 that exists at the lowest part of the relief pattern is removed by means of a plasma etch or chemical removal process 406. Such a process zone may not be required in processes in which the mask layer is formed in such a way as to not have residual mask material requiring removal, as described elsewhere in this invention. The masked film with an underlying material layer exposed through the openings in the mask layer 407 is then directed into a material removal zone or region 408 wherein the first material 409 from the material layer is selectively removed through the use of removal processes 410 such as plasma or chemical etching, etc. Although a single etching zone is shown, additional zones may be used to remove material by the same or different such removal means. Further, material layer(s) 402 may include multiple layers comprised of one or more materials to be removed, and may also include a layer whose removal rate is substantially lower than that of an overlying layer, said underlying layer 413 acting as an "etch stop" to prevent further material removal. The masked film is then directed into a first deposition zone or region 412 wherein a second material 414 is added by vacuum deposition, chemical vapor deposition, chemical deposition, electroplating, electroless deposition, etc. Further layers may be added as needed, where one additional zone is shown as 416, where a third material 418 is deposited, by example.

The masked film with material(s) added over removed material(s) is then directed into a mask removal zone 420 wherein the mask layer is removed from the patterned substrate. In FIG. 3, this is accomplished by lamination, through the use of a pair of pressure lamination rollers 422, of a "strip sheet" comprising an adhesive layer 424 and a carrier substrate 426 supplied from a supply spool 428. The adhesive can be a pressure sensitive adhesive, heat activated adhesive, radiation cured adhesive, etc., where the pressure, heat, radiation, or any required adhesive fluid or component is supplied in zone 420. Upon delamination of the temporarily bonded adhesive-mask composite structure 430, the substrate containing the desired pattern 432 and strip sheet containing the mask material and excess added material 434 are rewound on spools 436 and 438, respectively.

Although not shown in FIG. 3A, it should be noted that other means of removing the mask material, such as solvent swelling or dissolution, etc. may be used in place of the adhesive-strip sheet process, where such processes may take place by lamination of a strip sheet with a solvent, chemical, or mixture, or by use of dip tanks to likewise remove the used mask layer and any excess added materials.

It should also be noted that the series of process steps described herein can be designed to be carried out in a single continuous roll-to-roll operation, or as a series of single or multiple R2R process steps, depending on compatibility of the various sequential process steps, machine complexity, cost factors, etc. For example, removal of residual mask pattern material by a first plasma etching process may be followed by a second etching process, where the etch conditions (gasses, carrier gas, power, etc.) of the zones may be different, which in turn may be followed by additional etch zones as needed, and where some or all of said processes may be carried out in a single continuous (vacuum) R2R process, as needed, where 411 shows the separation of the various process zones schematically.

Depending on the specific materials and requirements of the process, the patterning operation and/or mask removal process can also be carried out in a vacuum roll coater, or, alternatively, one or more of the steps of patterning, chemical etching, and mask removal may be carried out in tandem in an atmospheric coater.

FIG. 3B depicts a cross-sectional view of this process, where the numbers have the same reference as those in FIG. 3A. In FIG. 3B, patterning tool 440 is shown in "A) Form Mask Layer."

Figure 4:
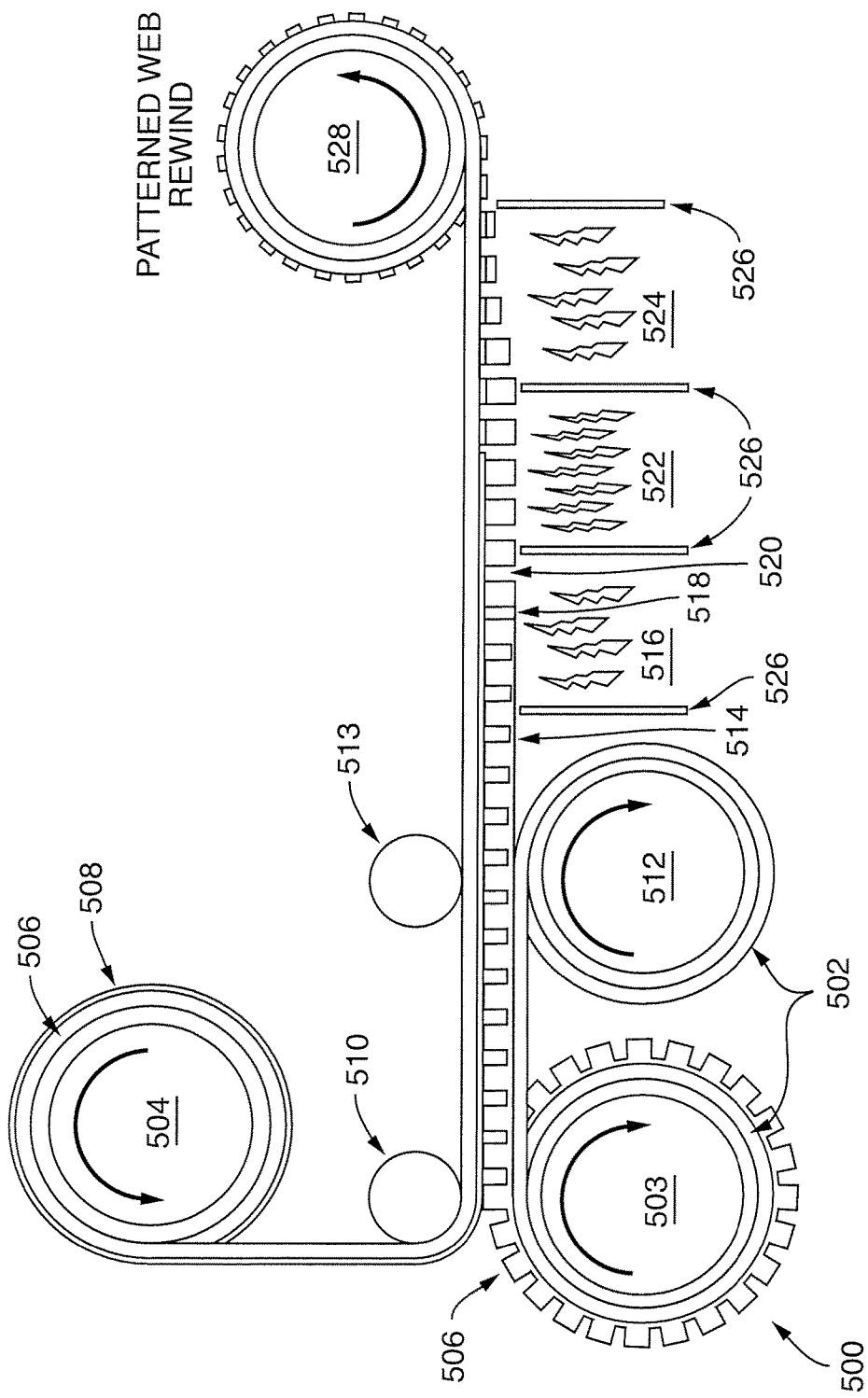
FIG. 4 depicts a roll-to-roll (R2R) process/apparatus for forming desired pattern on flexible substrate by use of transfer mask.

FIG. 4 depicts a roll-to-roll (R2R) process/apparatus for forming desired pattern on flexible substrate by use of transfer mask. A roll of substrate is shown containing a mask layer 500 having a relief representation of a desired pattern coated on substrate 502 is laminated against a substrate roll to be patterned 504, consisting of a carrier film 506 and a first material layer 508, where lamination force is applied by roller 510. The mask layer is transferred from the "donor" film 503 to the "receiver" film 504 by means of one or more of the following: an adhesive layer coated over the first material, a release material coated on the top surface 506 of the mask pattern, a release layer between substrate 502 and mask layer 500, or the intrinsic adhesion of the mask layer to the first material (which may be activated by the application of heat). The carrier substrate 502 is separated from the mask layer 506, where another roller 513 may be used to assist the separation, and the substrate is rewound on roll 512.

The "inverted" mask structure 514 is directed into a first zone or region 516 in which residual mask material 518, plus any residual adhesive that exists at the interface of the mask layer and the first material layer. The masked film with an underlying material layer now exposed through the mask openings 520 is then directed into a material removal zone or region 522 wherein material from the first material layer 508 is selectively removed through the use of removal processes such as plasma etching, etc. The film is then directed into a subsequent mask removal zone 524 wherein the mask layer is removed from the patterned substrate by etching. The various zones may be separated by 526 to optimize the various process conditions. The substrate with the desired pattern layer is rewound on roll 528.

It should be noted that, once the mask layer has been etched to expose the underlying material or substrate, any of the process options described for FIGS. 1A, 2A, 2B, and 3 also apply to this process.

Figure 5A:
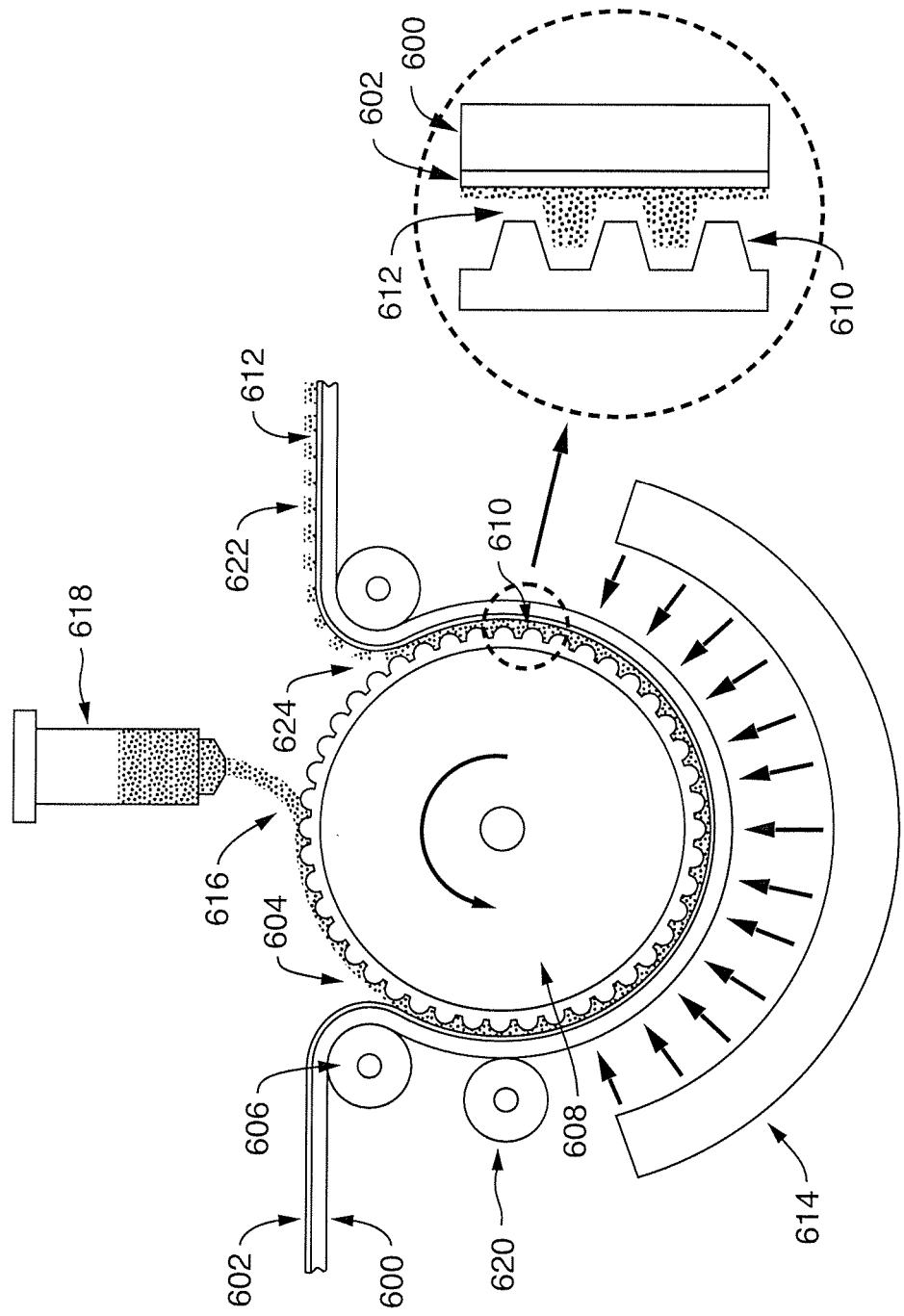
FIG. 5A depicts a continuous roll-to-roll (R2R) process/apparatus for forming patterning mask layer pattern on flexible substrate.

FIG. 5A depicts a continuous roll-to-roll (R2R) process/apparatus for forming patterning mask layer pattern on flexible substrate. In FIG. 5A, roll of substrate 600 having a first material 602 on one surface of substrate 600 is directed into a first nip location 604 where an engagement roller 606 presses said substrate against rotary patterning tool 608 having a relief pattern 610 complementary to that of the desired mask pattern 612. According to known art, such a tool pattern can be transferred into a surface layer by use of any one or a combination of the following processes: radiation (thermal, electron-beam, UV, etc.), pressure, chemical treatment, etc.

For the illustrated example, radiation source 614 is used to solidify a radiation-sensitive liquid 616 that is dispensed from reservoir 618. And additional roller 620 may be used to improve the uniformity of the fluid distribution prior to initiation of solidification. Fluid 616 may also be applied to incoming film 600, either as a stream, drips, spray, or uniform pre-coated layer as from a gravure or other such coating device. Such coating methodologies may also be used to apply the liquid to the rotary tool 608.

It is important that in the case of radiation curing, fluid 616 is optimally formulated such that radiation that can be transmitted through the substrate and first material layer (the latter being, for example, a transparent conductive material) is capable of activating the solidification of fluid 606.

Figure 5B:
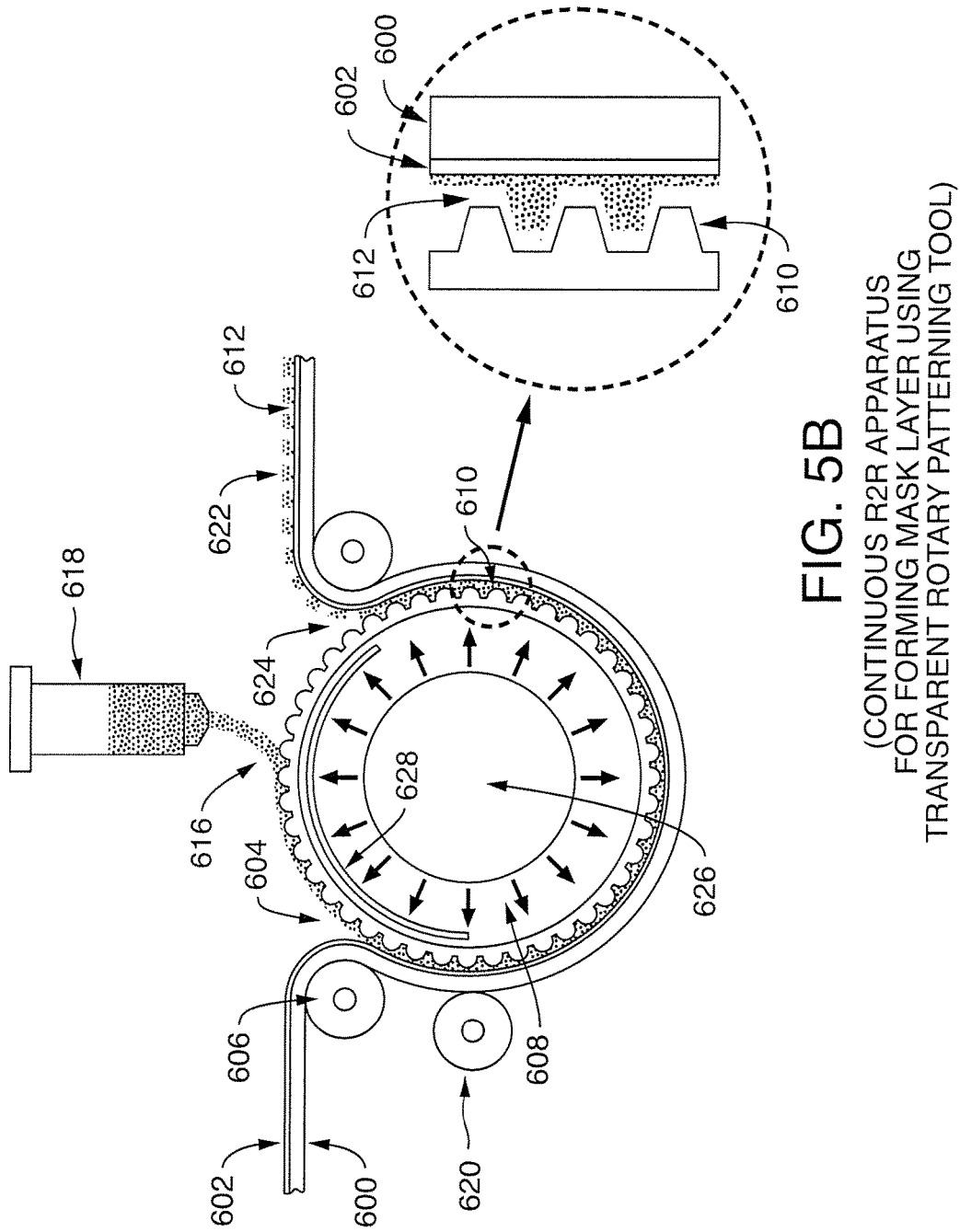
FIG. 5B depicts a transparent patterning too.

FIG. 5B depicts a transparent patterning too. If these conditions cannot be met, then a transparent patterning tool, can be employed (FIG. 5B), where radiation source 626 is used to solidify the fluid 616, such as by UV radiation, where the rotary patterning tool 610 is transparent to radiation emitted from source 626 and fluid 622 is capable of being cured by said radiation wavelength. Radiation shield 628 is used to prevent solidification of the fluid prior to uniform distribution at rollers 604 and 620.

After the fluid is solidified by the methods of FIG. 5A or 5B, the substrate 600, first material layer 602, and solidified and patterned second material layer 622 is separated from the rotary patterning tool at location 624, thereby producing a masked pattern layer on a substrate. This material can either be rewound and supplied to any of the processes illustrated in FIGS. 1-4 or could be used in a tandem process where the mask material is fed into a subsequent process step, as described in the same FIGS.

Figure 6:
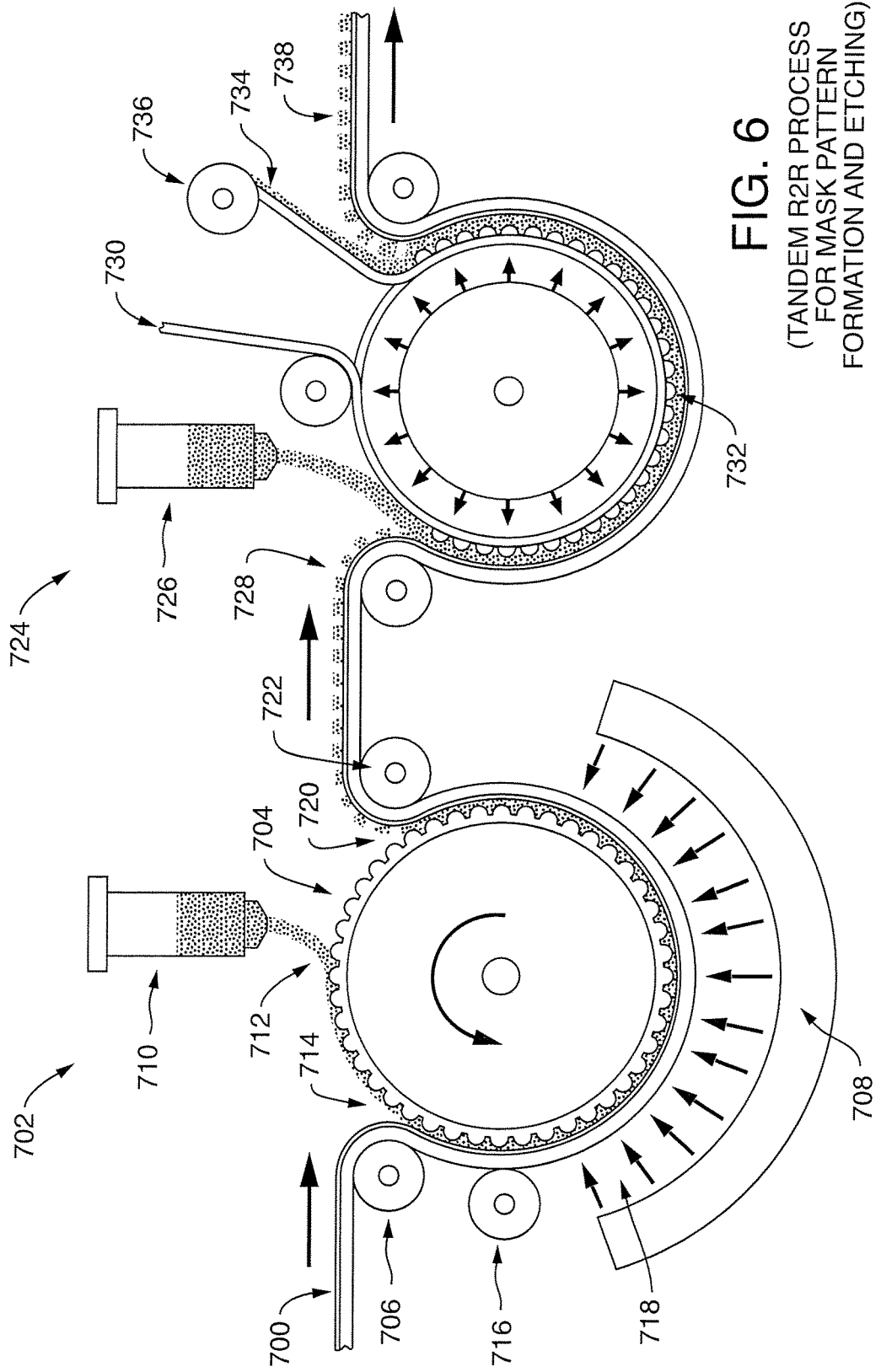
FIG. 6 depicts a tandem R2R process/apparatus for mask pattern formation and etching.

FIG. 6 depicts a tandem R2R process/apparatus for mask pattern formation and etching. FIG. 6 illustrates one possible configuration in which two distinct processing steps can be carried out in a continuous serial operation. In this case, a mask formation process is followed by a liquid etch (or liquid deposition) step, and additional steps could be used as well to form a complete process or subset thereof.

Substrate 700 can be fed into a mask formation station 702 which consists of a rotary mask forming drum tool 704, one or more input contact roll 706, a radiation source 708, and a fluid dispenser 710 which dispenses mask forming fluid 712 onto the surface of the mask tool. As the mask drum rotates, the substrate is carried into contact with the fluid and the mask drum at location 714, where the fluid is initially spread across the width of the substrate. A pressure roll 716 may optionally be used to further improve the uniformity of the fluid layer prior to solidification. Further rotation brings the substrate/fluid/drum surface into an area 718 in which the fluid begins to solidify by the action of the actinic radiation source 708. Further rotation brings the laminate structure to position 720 where the now solidified mask material is separated from the tool, typically by wrapping around an exit roll such as 722. It should be noted that the region of the circumference in which the radiation source impinges on the substrate/fluid/drum may be maximized in order to allow maximum exposure to maximum film processing speed.

The substrate with mask now enters a next station 724 wherein dispenser 726 dispenses etching fluid 728 between mask pattern surface and strip sheet 730. The etching action is accelerated by the application of heat by means of heated drum 732. The spent fluid is absorbed into an absorbing/neutralization layer 734 coated on substrate 730 and rewound onto spool 736 after separation from the etched mask pattern layer 738.

Figure 7:
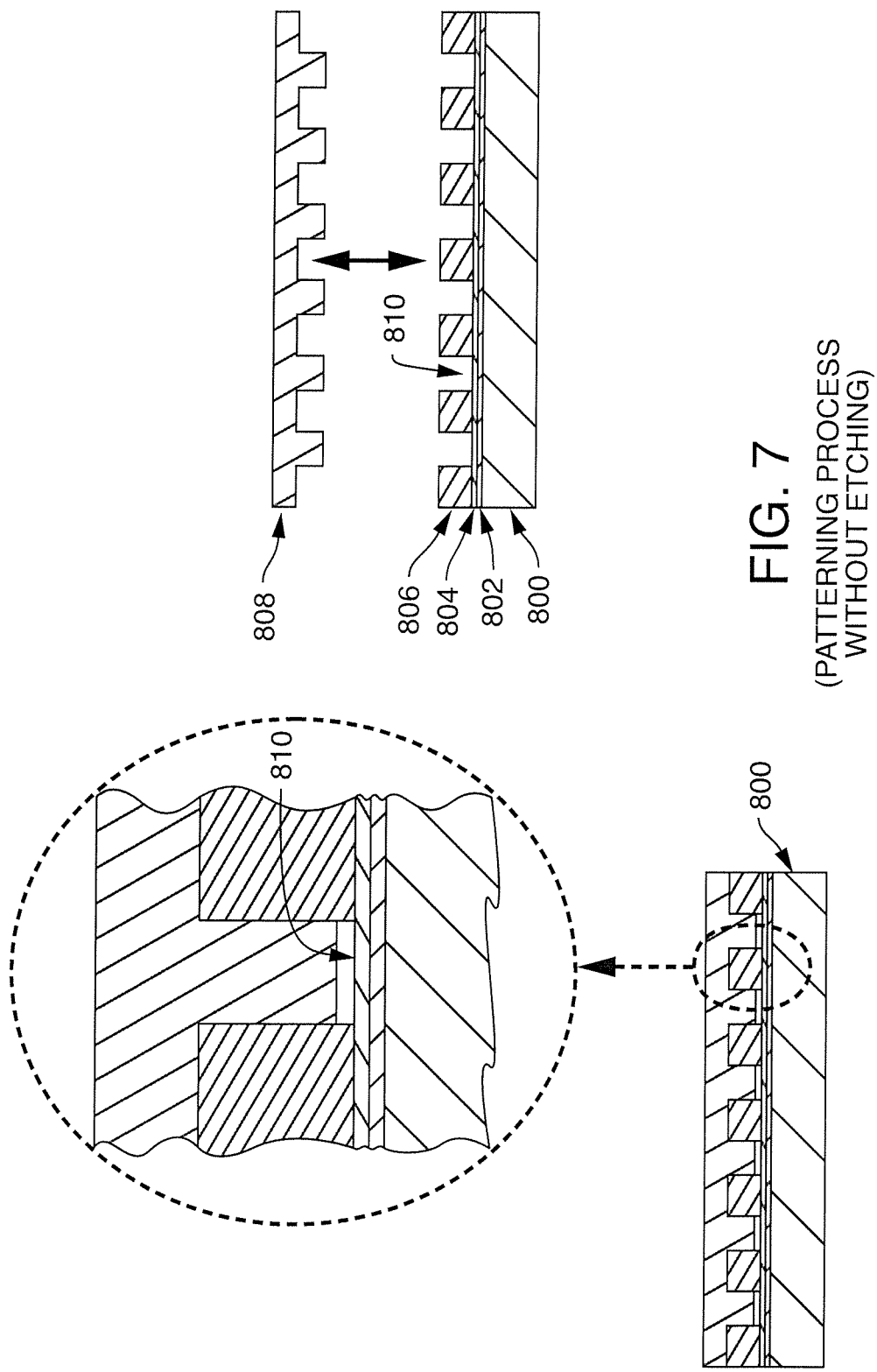
FIG. 7 depicts detail of R2R patterning process/apparatus without formation of residual mask layer.

FIG. 7 depicts detail of R2R patterning process/apparatus without formation of residual mask layer. In FIG. 7, substrate 800, having optionally a first etch stop material layer 802, a second material layer 804 to be patterned, a liquid mask pattern material 806 is put in contact with pattern tool 808. Removal of tool 808 from mask material 806, after suitable solidification by action of radiation, chemical treatment, etc. as described elsewhere in this application, results in the formation of a mask pattern that is complementary to that of tool 808.

The formation of the mask layer can occur substantially without residual mask material in the bottom of the pattern area 810 by proper choice of mask material, tool material, second material layer 802, as well as the conditions under which the tool and substrate are used together, including pressure, contact time, separation angle, separation speed, etc.

Figure 8A:
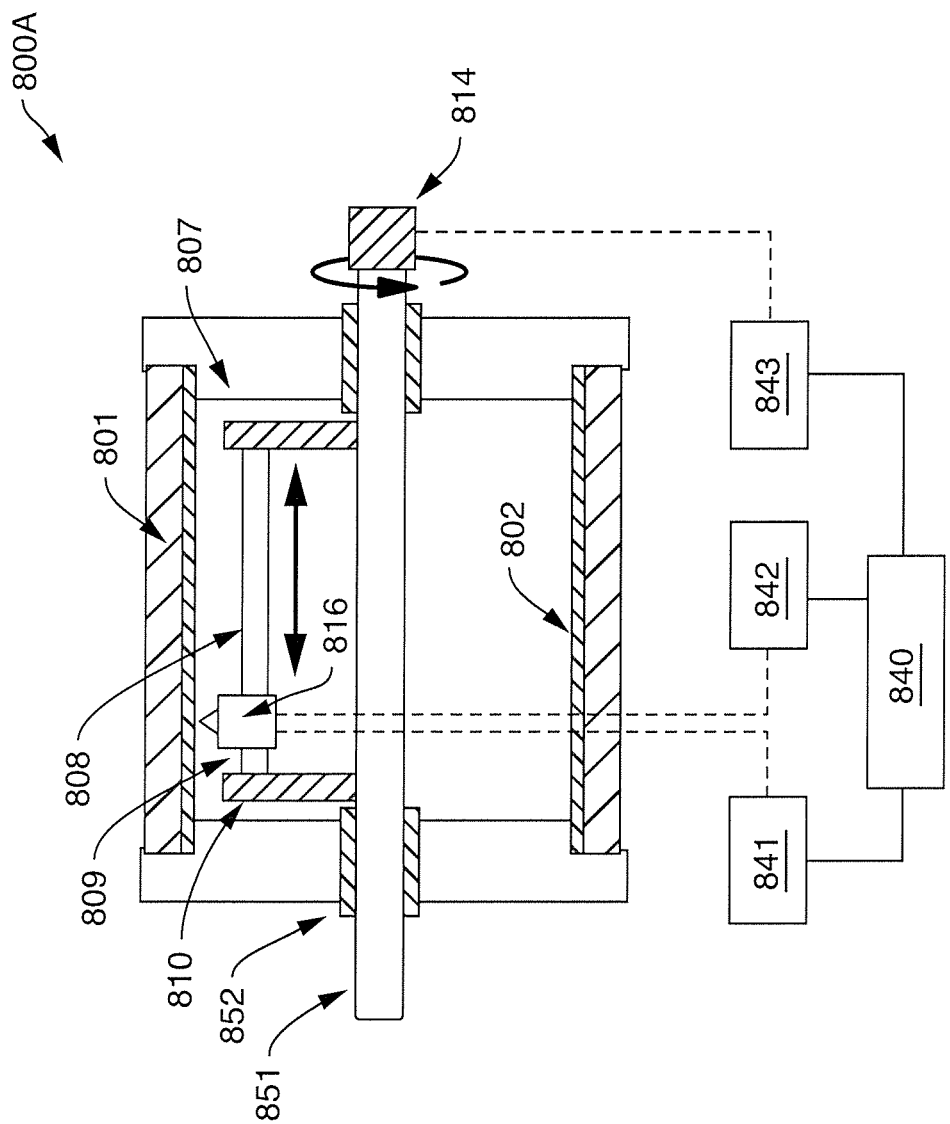
FIG. 8A is a schematic view depicting generation of a master pattern on inside of continuous drum.

FIG. 8A is a schematic view depicting generation of a master pattern on inside of continuous drum. An apparatus 800A is shown including a movable radiation source for recording information-bearing features on an inner surface of a support cylinder 801, in accordance with a further embodiment. The apparatus (or system) 800A can include a movable radiation head assembly 809 disposed within the bore 803 of the support cylinder. The head assembly 809 can include a radiation source for recording a desired pattern, e.g., information-bearing features, on a substrate 802 that has been applied to the inside surface of the support cylinder 801. One or more centralizing end bells, or disks, 806, 807 may be present for holding the head assembly within the cylinder 801. One or more support members may be present to support the support cylinder 801, and may be connected to the one or more end bells 806, 807. A support member in the form of a central shaft 851 extending through bearings 852, 853 may be used in exemplary embodiments. A motor 814 may be present for rotation of the shaft 851. To facilitate improved precision and accuracy in patterning, or pattern formation, the bearings 852, 853 may be air bearings in exemplary embodiments.

The apparatus 800A may include a frame, e.g., track 808 and legs 810, 811, to support movement of the radiation source 809 relative to the cylinder 801. For FIG. 8A, the frame is located within the bore 803 of the cylinder 801. In exemplary embodiments, the track 808 can be parallel or substantially parallel to the support shaft 851. The movable head assembly 809 can include an actuator 816 (e.g., a linear actuator) configured to move the radiation source along the track 808.

The radiation source used for assembly 809 may be a light source of any suitable wavelength and degree of coherence. In further embodiments, ion sources and/or e-beam sources may be used as the movable radiation source. In exemplary embodiments, a laser such a suitable semiconductor diode laser or a solid state laser is used for the movable radiation source. The output of the radiation source, e.g., a laser output beam, may be modulated by a suitable controller 841. The head assembly 809 may include autofocus and other control circuitry as necessary to maintain the position and uniformity of the produced radiation, e.g., optical output beam. The translation of assembly 809 by the linear actuator 816 may be controlled by a suitable position controller 842.

To produce relative movement between the head assembly 809 and the cylinder 801, the cylinder 801 may be rotated about its central shaft 851 while assembly 809 is simultaneously translated along the direction of the longitudinal axis of the cylinder 801. During such motion, the output of the radiation source of assembly 809 can be modulated to produce exposure of layer 802 according to the desired pattern. Smooth continuous motion of the radiation source, or its radiation, can be used to produce a spiral pattern, or other desired pattern(s) on/in the selected surface of the support cylinder 801. For example, intermittent rotation and translation of the radiation source relative to the selected surface of the support cylinder can be employed to produce concentric patterns.

Rotation, translation, and radiation output (e.g., laser beam intensity) control of assembly 809a may be synchronized and programmed through a master controller device 840. Example of a suitable master controller device 840 can include, but are not limited to suitable programmable logic controllers (PLCs), computers, suitable processors, field-programmable gate arrays (FPGAs), or the like. It may also be appreciated that alternative techniques for moving the radiation output with respect to the selected surface of a support cylinder, with any desired coating(s)/layer(s), may be used. For example, in certain embodiments, the radiation source or its output may be held steady while rotating and translating a support cylinder in a desired way. For further example, the radiation source or its output could be rotated while the cylinder 801 is translated to achieve writing/recording of the desired pattern. While FIG. 8A shows a radiation source configured and arranged to apply a desired pattern to an internal or inner surface of a support cylinder 801, other embodiments may include a radiation source configured and arranged to apply a desired pattern to an external surface of a support cylinder 801, as shown in FIG. 8B.

Figure 8B:
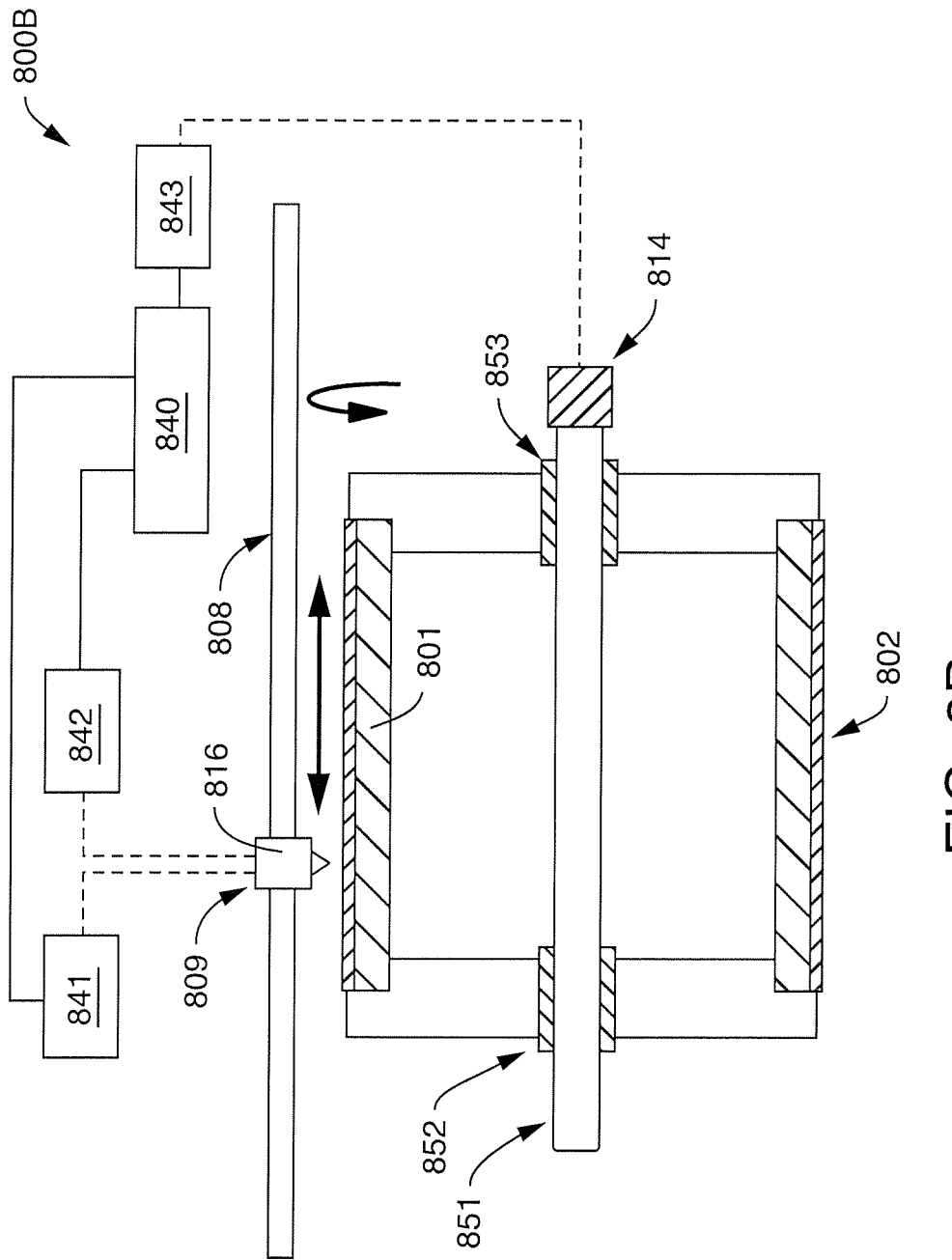
FIG. 8B is a schematic view depicting generation of an external master pattern on a continuous drum.

FIG. 8B is a schematic view depicting generation of an external master pattern on a continuous drum. An apparatus 800B is shown including a movable radiation source for recording information-bearing features on an outer surface of a support cylinder 801, in accordance with further embodiments. Apparatus 800B is similar to (and includes like numbering) apparatus 800A shown and described for FIG. 8A, however, the substrate layer 802 is disposed on the outer radial, or exterior, surface of the support cylinder 801. For this configuration, the movable radiation source assembly 809 is configured to move along a frame, e.g., track 808, that is located exterior to and in suitable proximity with the outer surface of the support cylinder 801.

In addition to the use of apparatus 800A-800B shown and described for FIGS. 8A-8B, other indirect writing techniques including lithography may be used to prepare a desired pattern in/on the selected surface of a support cylinder. Lithographic techniques may employ a photomask ("stencil"), either in direct contact with the substrate ("contact printing"), or by projecting the image of the pattern onto the substrate ("projection printing"). For such lithographic techniques, the selected surface (internal or external) of the cylindrical support cylinder is coated with a photosensitive layer, e.g., as shown in FIG. 8A, and radiation of an appropriate wavelength is used to expose the photosensitive layer through the photomask. The photoresist may subsequently be developed to obtain a desired relief pattern.

Other suitable indirect writing techniques can include holographic techniques in which a photoresist-coated cylinder is exposed to a standing wave pattern made by the interference of multiple laser beams. In such embodiments, a photomask may not be necessary, however, the ability to write certain types of patterns may as a consequence be impacted, since the laser interference pattern may have a high degree of spatial uniformity.

For various application, it can often be desirable or necessary to create copies (replicas) of rotary pattern tools. One reason for this is that some materials, e.g., certain photoresists, are very fragile and not suitable for the rigors of manufacturing. Another reason might be based on the need to convert an internally-patterned drum into an externally-patterned drum, as the former is not directly useful in pattern replication processes. A further reason is to convert a positive relief pattern image into a negative relief pattern image, or vice versa. Another reason is to create multiple identical copies of an original pattern tool for high volume production, particularly when copies can be produced more cheaply and more rapidly than the original.

Certain replication techniques for patterned drums are described in U.S. Pat. No. 4,478,769. Applicant's above-reference co-pending application described improved replication techniques that are generally applicable to ultra precise and/or nanoscale patterns or are compatible with a range of drum diameters and thicknesses. Suitable replication techniques, may include but are not limited to, metal plating, such as electroless Ni or electroformed Ni or other metal forming technique, radiation-curable polymeric materials (including UV and e-beam), and epoxy or silicone materials. An electroplating embodiment for replication of a drum pattern is shown in FIG. 9.

Figure 9:
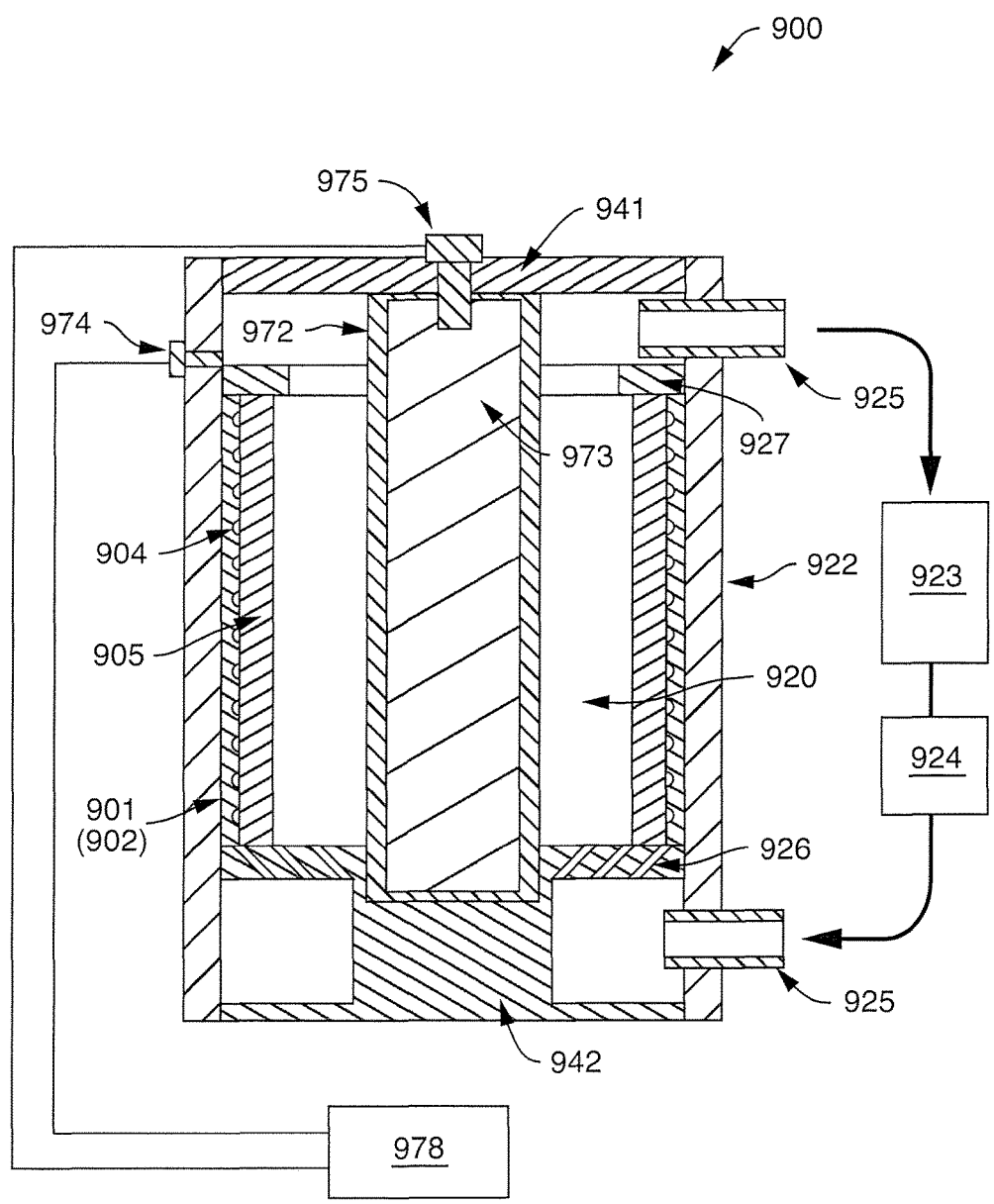
FIG. 9 is schematic view depicting a system for creation of a nickel (Ni) replica cylinder by electroforming.

FIG. 9 is schematic view depicting a system for creation of a nickel (Ni) replica cylinder by electroforming. An electrochemical deposition cell 900 is shown for making a durable pattern replication tools having a negative-relief replica of a pattern formed on an inner surface of a support cylinder 901, in accordance with further embodiments. As shown, a support cylinder 901 is placed within the deposition cell 900 An outer cylinder 922 of the cell 900 may be sized and adapted to securely hold the support cylinder 901 having a relief patter on its inner surface, such as described previously for FIGS. 1 and 2. First and second end disks 941, 942 may be present to seal cylinder 922 to circulate a metal-containing solution suitable for electrochemical or electroless plating. The deposition system 900 may be used to make a durable sleeve with an inverse or negative of the relief pattern on the inner surface of a support cylinder. The resulting durable sleeve may be used for as part of a replication tool, as described herein. A metal containing solution, e.g., aqueous, is circulated within the cell 900.

In the case of electroforming, an electrolyte, e.g., aqueous nickel sulfamate solution, is circulated between anode and cathode surfaces, and a voltage is applied between the two surfaces. This applied voltage results in the deposition of nickel (Ni) metal onto the patterned surface, where the total deposit thickness is determined by the amount of current passed during the deposition process. The details of the electroforming process are well known in the art. In other embodiments of the metal replica formation process, a Ni (or other conductive) layer is deposited by means of electroless deposition, a widely used process in which metals are formed by reduction onto a catalytic or nucleation layer (e.g., silver mirror formation) on the surface to be replicated. Several key variables, including time and temperature, are used to control the thickness of the deposit, which can, for example, range from microns to millimeters, as desired. The details of the electroless deposition process are known in the art.

With continued reference to FIG. 9, system 900 may include a closed recirculating system including a reservoir 923 from which a metal-containing solution 920 is pumped, an in-line filtration system or filter 924 to remove any particulate and other unwanted matter, and heating elements (not shown) by which the reservoir 923 is caused to reach and maintain a desired operating temperature. The system 900 may include suitable pumping and valving components/ means to allow the metal-containing solution to continuously circulate under controlled (and monitored) conditions. Suitable pumping and valving means can include but are not limited to suitable pumps, pipes, valve, and related components.

The metal-containing solution 920 circulates through cylinder 922 as part of a plating process. The solution may be heated in reservoir 923 and passed through filtration unit 924 before entering the cell at location 925. The support cylinder 301 with photoresist substrate 902 may initially serve as a part (e.g., a boundary wall) of the deposition and fluid recirculation pathway. In exemplary embodiments, the solution 920 exits the cell at the top outflow pipe 921 and returns to reservoir 923 for reconditioning and recirculation to the cell. One or more non-conductive stop rings 927 may be located on the substrate, e.g., toward one end of the cell, to facilitate definition of the ends of the deposited replica by inhibiting the deposition process at this surface.

A spiral distribution flow director 926 may, as shown, optionally be present at the bottom of the cell to create a fluid vortex pattern within the cell 900 to facilitate a higher flow velocity near the cylinder wall. Such a flow improvement may facilitate thorough mixing of the solution, as well as dislodging and sweeping away of bubbles or other byproducts or impurities from the inside walls of the cylinder 922.

Also shown in FIG. 9 is an optional electrical circuit 970 for use in exemplary electroplating embodiments. The electrical circuit 970 can provide sufficient current paths for electrodeposition of a sleeve layer 905 onto the patterned substrate or layer 902 or patterned support cylinder 901 containing the first relief pattern. The electrical circuit 970 can include two electrodes 971, 972 for applying a current through the metal containing solution 920. The inner surface of the pattern-containing support cylinder 901 may be coated with a thin layer or coating of electrically conductive material (not shown) forming the first electrode for initiation of electroplating. The thin conductive coating can be achieved by suitable techniques such as vacuum deposition, or electroless deposition. The first electrode can be connected via terminal 974 and appropriate electrical connection(s) to power supply 928. The second electrode 972, e.g., as a nickel assembly, may be positioned within cylinder 922 and may be connected through a terminal 972 and suitable electrical connection(s) to power supply 978. Circulation of the electrolyte 920 within the cylinder 922 provides an electrical path between the electrodes and the power supply and completes the electrical circuit 970. In exemplary embodiments, the second electrode 972 includes Ni pellets (or solid rod or the like) placed a titanium basket, which in turn is surrounded by a filter bag to retain any particulates produced as byproducts of the electroforming process.

To electroplate the inner surface of the support cylinder 901 and thereby form a durable sleeve including a replica relief pattern, current passes through the electrolyte solution between the electrodes. In accordance with Faraday's Law, the thickness of the deposited metal (e.g., nickel) layer 905 is proportional to the total charge passed through the cell, as is known in the art of electroplating. The process can be terminated after any length of time, where the thickness of the deposited layer is thereby proportional to the cumulative amount of current passed through the cell, as well as other factors, and which typically may range from a few microns to many millimeters in thickness. When the thickness of the deposit has reached the desired value, such as 0.010 inches for one example, the electrodeposition process may be terminated by removing the voltage, draining and disassembling the cell 900.

General Considerations

An important aspect of making high quality copies of rotary patterning tools, included seamless tools, is the separation of the copy from the original without damaging the original (or copy). This can be done by the referenced methods of Applicant's referenced application, which is incorporated herein, which includes chemically softening or removing the original pattern.

The choice of materials is of particular importance, since the reduction or elimination of the residual layer is dependent on the relative adhesion of the tool, the mask material, and the material layer into which they are in contact. Low adhesion and wetting will allow the mask fluid to "de-wet" or repel form the surfaces prior to curing, thus minimizing the residue layer.

As described in Applicant's referenced co-pending U.S. application Ser. No. 11/337,013, filed 20 Jan. 2006, entitled "Replication Tools and Related Fabrication Methods and Apparatus," separation of a durable drum from master pattern by chemical stripping.

Separation of the copy from the tool may also be accomplish by using carefully controlled thermal expansion/contraction, by which means the inner sleeve is chilled while the outer sleeve is heated in order to maximize the dimensional change between the inner and outer elements. It is also possible for the patterning drum to be made in two or more segments that can be disassembled, as taught by prior art, but this creates an undesirable discontinuity, (seam), in the drum which can lead to disruption of the pattern or replication process, wasted drum surface area, as well as limiting the ability to make a drum true (round) to a very high tolerance.

It is generally important that the polymer layer is in a solid or near-solid state (such as that resulting from the action of the radiation or chemical treatment or reversal of the chemical softening process) when the tool is separated from the polymer in order to reproduce the details of the pattern accurately. It may, however, in some circumstances be advantageous to remove the tool while the polymer still retains some degree of flowability in order to subsequently modify the pattern (such as rounding off sharp edges or features to form slopes or curves, or reduce profile dimensions, etc.). In some cases it may be of advantage to post-treat the polymer layer after tool separation, using chemical or radiation exposure, to additionally harden or modify the structural or surface characteristics of the polymer layer. Other process variables may include fluid distribution (coating) and hardness/compliance of the drum/nip interface.

In order to use the actinic radiation (e.g., photons and/or suitable ions) as a cure method for forming the structured polymeric layer with substrates that intrinsically do not transmit said radiation or when additional layers are interposed that do not transmit such radiation (e.g., metallic layers), the patterning drum can be formed from radiation-transmitting material (including glass, quartz, and polymeric materials).

The use of substrates having radiation absorbing properties (or having radiation absorbing layers) that otherwise prevents monomer cross-linking can be enabled by modification of the spectral sensitivity of the monomer formulation to allow reaction to the transmitted light. For example PEN (polyethylene naphthalate) generally does not transmit light shorter than 380 nm, but use of monomer formulations sensitive to light longer than this cutoff value (e.g., 400 nm blue light) allows cross-linking (curing) of these materials.

The polymeric layer material can be introduced into the pattern formation process by any of several techniques, such as through the use of pre-coated substrate, or by applying liquid monomer or polymer to a carrier substrate prior to the point at which the patterning drum and polymer first come in contact (the "input nip"), or by applying liquid monomer or polymer directly to the pattern drum (or by direct application at the input nip. The polymer may consist of pure polymeric precursor material ("100% solids") or be diluted by solvent or aqueous diluent(s), which are generally removed prior to contact with input nip. Use of diluents is used to reduce polymer viscosity in order to produce thinner and/or more uniform polymer distributions. Application of the polymeric material or solution may be carried out by a number of techniques well-known to the art, such as slot, doctor blade, gravure coating, injection, etc. It is a method of this disclosure that liquid polymer may be dripped, via one or more needles or other type sources, including ink-jet arrays, directly onto the rotary patterning tool or incoming web or nip area between same, such that the action of the engagement of a nip roller and the patterning tool causes the liquid to spread across the width of the tool.

To further enhance fluid distribution uniformity, a second pressure roller can further spread the fluid prior to solidification of the liquid polymer. The first nip may also have a fixed gap to "pre-spread" the fluid prior to the second pressure roller. Additional rollers may be used as well, where the various nip rollers may be of different durometer (flexibility) or surface finish for optimum patterning results. For undiluted polymers, one or more "pre-nip" lamination stations may be also used to produce a more uniform and/or thinner layer prior to contact with the patterning tool or prior to initiation of patterning process.

For pattern replication based on chemical softening of a pre-coated polymer layer, such methods of fluid distribution also apply to the chemical or solvent softening agent(s).

The continuous rotary action of the patterning tool and R2R processing apparatus causes the substrate and polymer to be continuously put into contact with the patterning tool (typically with a pressure in the range of less than one to tens of pounds per square inch, depending on the viscosity, among other things, of the fluid), at which time the process of transfer of the pattern begins, and after sufficient time in contact with the patterning tool ("dwell time", which can range for a fraction of a second to tens of seconds, depending on the combination of surface area in contract with the patterning drum and web speed), the substrate and patterned polymer layer are continuously separated from the drum tool. At this point additional processing may take place, which can include post-curing or other treatments, or simply rewinding of the patterned film. It is also a useful aspect of this method that, in order to minimize introduction of artifacts or damage to the patterned polymer surface, the R2R processing apparatus is configured to eliminate any direct contact between the patterned polymer surface and any rollers or other components after the ISM layer is removed from the patterning drum surface.

Mask Pattern Opening

The structured polymer layer can act/function as a relief mask for transferring the pattern of the polymer to the underlying substrate. The substrate may consist of a single support layer or a more complex structure having one or more polymer or additional coated layers. The substrate may include metals, inorganic materials such as oxides & nitrides, transparent conductive layers, nanoparticles (including Si and carbon nanotubes, fullerenes, etc). The areas of structured polymer layer in closest proximity to the substrate (the "bottom" of the pattern elements, or "residual polymer layer") need to be open or cleanly devoid of polymer material in order to provide access to the underlying substrate layers for the subsequent operations, such as vacuum or chemical deposition, plating or wet or dry etching.

The ISM layer may be processed in order to produce precise openings for subsequent processing, and this may be done by a dry or chemical etch to remove residual polymer, where anisotropic or isotropic conditions may be used to retain or modify the openings, respectively, depending on the specifics of the application. Such processing can be done by dry etching, such as for example with an $O_2$ inductively coupled plasma etch for removing residual polymer mask material, where other etch processes can be used for other mask materials. A brief exposure to a solution of diluted chemical and/or solvent(s) can in some cases be used to expose the underlying substrate through removal or swelling of residual mask material, where such mild conditions are required due to the residual material and the mask material being essentially the same constituents. The absorption characteristics (e.g., swellability/solubility) of the mask polymer in the solvent must be controlled such that only the residual material is removed, while not appreciably affecting critical pattern structures. This can be accomplished by proper choice of solvent or use of solvent blend having one or more non-active diluents that are miscible in the solvent and that decrease the effective solubility of the polymer. This method is generally effective when the residual layer is very thin and may be caused to "de-wet" or dissolve under such conditions.

Figure 11:
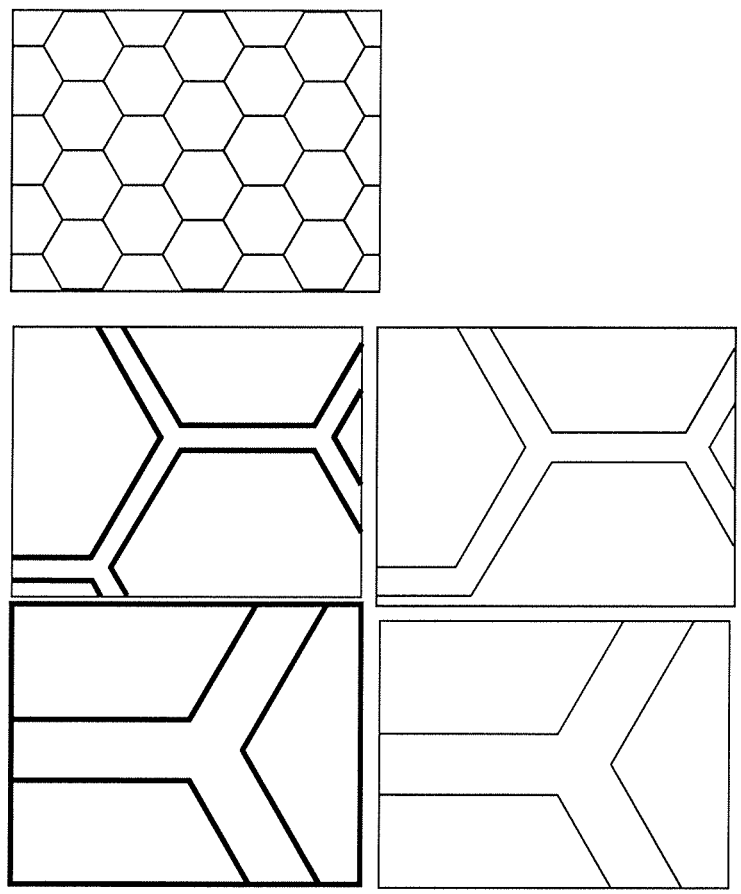
FIG. 11 depicts a maskless patterning (Al on PET), in accordance with an exemplary embodiment of the present disclosure.

The residual polymeric layer may be advantageously removed or minimized in order to both assure the most accurate pattern formation on the substrate and minimize the processing steps. Several methods used to accomplish this include careful selection of the patterning polymer materials and substrate surface properties, and the design of the patterning tool and choice of pattern formation process conditions. For example, the pressure, hardness (e.g., as indicated by a durometer value), and geometric configuration of the input nip in combination with the polymer viscosity and other polymer properties, can be used to minimize the separation between the patterning tool and the substrate surface. In some cases, the use of minimal-wetting polymer and substrate combinations, combined with above process conditions that reduce the residual polymer layer, can result in surface dewetting of very thin residual layers to expose the substrate without requiring significant post-processing (etching, etc.), as shown in FIG. 11. The control of temperature can be used to adjust the viscosity of the monomer/polymer formulations to enhance this effect, as well as other material characteristics (mass transfer/flow/rheology, etc.).

The material removal conditions such that the material removal rate decreases substantially when the residual polymer is cleared and the underlying layers are exposed. For etch processes, optimal etch conditions can be made to favor anisotropic removal such that polymer surfaces parallel to the substrate are removed at a higher rate than vertical surfaces, and although the effective thickness of the polymer mask is reduced, the critical dimensions of the openings are minimally affected. The selectivity of the etch process to remove the residual mask material at a much higher rate than the underlying material can be enhanced by proper choice of etchant gas mixture and etch conditions, and/or by use of a substrate with a lower etch rate than the residual mask material, or by use of another layer or layers between the substrate and mask polymer that has a very low etch rate for that mixture, which is known as a "stop" layer to the art. The establishment of differential etch rates may require optimization for each mask material/substrate combination.

In an R2R process, removal of the residual polymer from the embossed pattern (where necessary) in order to expose the underlying surface is accomplished in a continuous manner by unwinding the embossed substrate, exposing the embossed surface to any of the etching methods described above, then rewinding (after any required post process cleaning, drying, etc.). In exemplary embodiments, the masked surface is unwound in a vacuum chamber and while transiting from unwind to rewind is exposed to an plasma (such as inductively coupled or other plasma etch technique) with $O_2$ as the active etchant gas, as just one example, in order to remove residual mask material, where the polymer may be a radiation cured acrylic polymer or other such polymeric material as mentioned above. In other embodiments, an embossed mask pattern made using the "de-wet" method is unwound in an atmospheric coater and briefly passed through a tank containing a dilute solvent mixture in order to remove the small amount of residual polymer, then dried and rewound in a continuous operation.

Processing of ISM Patterned Materials

The substrate with in situ mask layer, as prepared by the previous series of steps, may be used in a R2R additive or subtractive process by which means material is continuously added or removed, respectively, and which will ultimately form the basis of the desired pattern. For either additive or subtractive processes, materials that can be used in this regard include any combination of metals, non-metals, alloys, organic, inorganics (oxides, nitrides etc), conductive organics, transparent conductive materials (e.g., indium tin oxide, etc.), polymers, dyes, inks, pigments, nano-inks, nanocomposites, nanotubes, for example. Other materials may also be used.

For embodiments including additive processes, the material can be coated over the masked substrate. This can be accomplished by any of the following techniques known to the art, including: vacuum deposition (e-beam, thermal, sputtering, CVD, etc.), atmospheric coating (solvent, aqueous, or neat), inkjet and other printing means, solution deposition (electrodeposition, electroless, and chemical), to name a few. It may appear that the use of some of these selective printing means, including ink jet, silk screen, and rotary printing, may be redundant in that they already have the ability to selectively add material and do not require a mask. However, the resolution of these techniques is relatively low compared to the method of this invention, but it is a method of this disclosure that the continuous R2R process in which the combination of using these techniques to overprint (i.e., where the printed area extends slightly beyond the boundaries of the masked area) the high resolution mask can yield, upon removal of the mask, patterns of much higher resolution than can be achieved by any of these printing processes alone.

An additional advantage to this aspect of the method is that, for materials that can be applied by such printing methods, the cost is reduced, since only those areas requiring material are overprinted, rather than the entire mask area, and in some cases the throughput may be increased, again since only selective areas need be coated. The use selective deposition of expensive materials in the form of nano-inks or formulations over the ISM layers may be of particular benefit in exemplary embodiments.

For subtractive (material removal) processing, the underlying material, which has previously been exposed by the means of the previous methods, is now removed in the exposed areas. This can be accomplished by any of the following techniques known to the art, including: "dry" (plasma) etching, chemical etching, selective removal (applying chemical agents by inkjet and other printing means), electroetching/reverse plating, laser ablation, to name a few.

Here, the use ablation or printing means (to selectively apply chemical removal agents) to the areas of underlying material exposed by the open areas of the ISM, may appear to be redundant, since these techniques already have the ability to selectively ablate or deposit chemical etchant material and do not require a mask. Again, as with the additive method, the resolution of such techniques can be relatively low compared to the pattern resolution capability of the present invention, but the combination of the use of these techniques with the high resolution mask to limit the topographic extent of the ablation or chemical etching can yield, upon removal of the mask, a pattern of much higher resolution than can be achieved by any of these processes alone.

An advantage of the subtractive dry plasma etching process is that this step can be combined with the previous step, residual polymer plasma removal, such that both steps can be carried out in the same vacuum coater, either in tandem or as two separate passes, by changing the etch conditions (gas mixture). This eliminates the need to "break vacuum" or change machines and leads to improved manufacturing efficiency. Further, a third pass in the vacuum etch machine, under the conditions used for polymer etching, can be used to remove the residual mask material (if necessary, an etch stop layer may be used over the substrate to prevent substrate etching). Again, this $3^{rd}$ step can be in tandem with either or both of the two previous vacuum steps (residual polymer removal and pattern material removal), offering a significant production advantage in that finished patterned material can be produced by the use of only two R2R machine operations (embossing and dry etching).

Over-Etching

In cases using the additive method where no etch stop layer is used under the polymer mask layer, or in cases using the subtractive method where no etch stop layer is used under the layer being removed, it is possible to over etch the substrate, resulting in the pattern of the open mask area being "transferred" into the substrate. This may be undesirable in some cases, which would then require precise monitoring of the etch process (or alternatively, using an etch stop layer). However, in some instances this may either not be objectionable or be beneficial. For example, if the finished (patterned) substrate will be overcoated with a protective layer, then over etching may not present a problem. When this layer is a polymeric material (for example, a polymeric protective hard coat), then the over etched structures will be filled in anyway. Furthermore, this over etching may serve to improve electrical isolation and improve protection and adhesion.

Material removal and material addition may be carried out in sequence using the same ISM, such that the patterns formed by the removal of material (subtractive processing) may be subsequently filled with a different material or materials (additive processing).

This offers the ability to produce multilayer patterns of one or more materials interspersed with patterns of different materials in an essentially coplanar form. For example, channels or traces may be first etched through an ISM into an $SiO_2$ layer on a polymer film by the subtractive techniques described above, followed by the vacuum deposition of a metal into the same channels. If the thickness of the deposited metal is made to be the same as the depth of the removed $SiO_2$, then upon mask removal the metal traces will be coplanar with the $SiO_2$ layer. The method can be extended to the etching of multiple layers underlying the mask and multiple added layers. Further, the added layer(s) may under or overfill the etched patterns. Coplanar versions of such structures can be useful in many areas, particularly when electrical isolation or physical protection of certain features is required, or when electrical contact lines are "flush" with the surface of a device, such as TFT, etc.

Polymer Layer Removal

Continuous removal of the used polymer mask layer after addition or removal of pattern material (including removal of any excess overcoated material from additive processing) is typically the final step in a patterning process, especially if additional layers are to be added. It is a method of this disclosure that the continuous R2R removal of the polymeric layer (and any excess added materials, herein referred to as the "used mask") may be accomplished by one of several means, including mechanical, chemical, or plasma means. It may be beneficial in exemplary embodiments to use a mechanical means for R2R removal. For example, a "strip sheet" (a means to carry away the used mask) can be unwound and placed into contact with the ISM layer of the processed substrate, the laminate "activated" to cause the strip sheet to adhere to the used mask, and upon delamination the strip sheet the used mask is bonded to the strip sheet, which is in turn rewound.

The means to effect the bonding may be pre-coated onto the strip sheet and may include any of a pressure sensitive adhesive coating (PSA), and heat seal adhesive, a co-extruded thermally-activated polymer film, a radiation-activated adhesive, a chemically-activated adhesive, etc. The means of activating the adhesive layer can be supplied by a heated roll, radiant energy source, laser or e-beam, solvent mixture, or chemical fluid, etc. In certain cases, where the adhesive does not outgas sufficiently to interfere with the vacuum processing, continuous removal of the used mask layer can also be carried out in tandem in vacuo.

In exemplary embodiments, the ISM layer is formed over the substrate to be patterned, and after the addition or removal of the desired material, a thin (0.5-1 mil) PET sheet containing a thin layer of pressure sensitive adhesive is nip laminated in a continuous R2R operation against the processed web, and at a subsequent delamination station the laminate is separated such that the used mask remains with the strip sheet. This can also be carried out with a heat-seal adhesive in place of the PSA, where the adhesive is thermally pre-activated such that it bonds to the used mask layer during lamination.

In exemplary embodiments, the adhesion of the mask layer to the substrate (or underlying layers) can be adjusted or selected to be less than that of the activated adhesive to used mask layer such that separation occurs with full transfer of the mask to the strip sheet and without damage to the substrate. The clean separation of the ISM layer can also be enabled by the addition of a layer that reduces the mask adhesion to the underlying layer, but this may not always be desirable, as the additional layer may potentially (chemically) contaminate the material being processed.

Separation may be accomplished by careful choice of mask material such that the intrinsic adhesion between it and the underlying layer is sufficiently strong to adhere when the pattern is formed, but less than the adhesion to the strip sheet upon delamination to allow clean separation. This mask removal procedure can also be carried out on batch (discrete) samples.

Polymer Layer Retention

In some instances it may be advantageous to leave the ISM layer in place rather than removing it, as for example when the mask pattern itself may offer a useful function for the structure. The three-dimensional mask structure may be used as microvessels to be filled with any number of types of material, where, after the residual polymer layer is removed, any of a number of coating methods known to the art could be used for filling. For example, after removal of the residual polymer to expose an underlying conductive layer or ground plane (metal or transparent ITO, etc.), the polymer mask could be filled with an imaging material that would be in electrical contact with the exposed layer for switching or activating the material in the mask structure. In this case the polymer mask itself might contain dyes or pigments to form a dark matrix for optimizing an imaging system made by this method. The mask structure could also be selectively filled with a conductive material to allow electrical contact with another layer, such that the filled mask structures act like "vias".

Retaining the ISM after additive processing would result in two planes of deposited material (the top surface and bottom surface of the mask), where proper design of the mask sidewall angle and deposition process would result in little or no material being deposited on the side walls. For electrically conductive deposited layers, this means that the upper and lower layers could be electrically isolated. It is further possible to under certain circumstances to selectively remove the top surface (added) material, by mechanical means using, for example, any of the adhesive-assisted delamination methods described previously to further define the desired pattern, where either the original substrate or the removed layer can be the final pattern. This type of selective removal requires the use of a deposited material with relatively weak intrinsic adhesion to the mask material, such that its adhesion to the strip sheet adhesive is greater than to the ISM layer and the adhesion of the ISM to substrate is greater than that of the additive to mask.

Another instance in which a retained polymer mask layer would be useful is in situations in which it would act as a protective, buffer, spacer, or planarizing layer.

Post Etch Processing

It may be beneficial that after the mask removal step, another light plasma cleaning step may be used in order to both clean the exposed surfaces and improve the adhesion of subsequent material to the patterned. Again, this can be done in the vacuum processor after mask removal without breaking vacuum, either as a tandem step or during a re-wind operation.

Reduction in Residual Polymer Layer

The removal of the excess polymer at the bottom of polymer relief structure (called the residual mask or 'scum layer') is a critical step in preparing the ISM for subsequent material deposition or removal by exposing and cleaning the underlying layer. It is also very desirable in terms of R2R process costs to reduce the plasma etch time, which is related to the amount (thickness) and degree of cross-linking of the residual polymer. This can become a rate determining step in the overall roll manufacturing process because the rate of polymer removal by the plasma etch process is relatively slow, and it is therefore useful to minimize the amount of scum polymer in the mask in order to reduce this step time.

It is a method of this invention to reduce the residue etch time by modifying the ISM formation process to produce a thinner residue and/or less cross-linked polymer mask layer. This is done by decreasing the degree of adhesion and/or wetting of the ISM fluid to the layer to which it is contact prior to and during the radiation curing process. De-wetting of the thin residue layer results in retraction of the polymer, which presumably occurs while the template tool is in contact with the fluid and substrate prior to initiation of radiation curing, when the fluid retains a degree of mobility before being cross linked.

One means by which this can be accomplished is by the purposeful incorporation of residual solvent(s) into the polymer during ISM formation in order to reduce the amount of mask scum polymer, presumably occurring as a result of a decrease in the adhesion and wetting between the polymer and the underlying material. The judicious choice of diluent and its removal conditions (temperature, air flow, etc. . . . ) allows a controlled amount of residual solvent to be incorporated into the ISM layer. Incorporation of diluent into the ISM layer has other benefits, including higher etch rates and improving the ease of the subsequent removal (liftoff) of the ISM layer.

A factor that that can be used to increase the rate of plasma scum removal, as well as aid in the subsequent mask liftoff, is the reduction of the radiation flux used to solidify the photocurable mask polymer. This is thought to result from a lower degree of crosslinking of the polymer and is also useful in the final removal (liftoff) of the used ISM layer.

Patterning Technique: Transfer Flexmask

In certain embodiments, the polymer mask layer may be formed on a separate support film ("donor sheet") and is subsequently transferred to the substrate to be patterned ("receiving sheet"), rather than being formed directly on the receiving substrate as in the in situ case. The transfer mask method offers several advantages: by carrying out the embossing process on a substrate separate from the receiving substrate, exposure of the latter to chemical or mechanical processing conditions related to the mask pattern formation can be minimized. This is a benefit in cases were the receiving layer is particular sensitive to processing conditions; another advantage is that "undercut" mask structures (where the size of the openings increases with depth) are possible, which is something that cannot generally be done by conventional embossing techniques. Undercut structures are useful when certain characteristics are required, such as minimal coating of sidewalls, or requirement for specific deposition profiles, etc.

After the mask pattern layer is created on the donor sheet, the layer is transferred to the receiving sheet by lamination, which then requires release of the polymer mask layer from the donor sheet upon delamination of the donor-receiver laminate structure. If the mask pattern has not been previously "opened" by etching or other means (as previously described), then this may be required after the mask layer has been transferred. The transfer of the polymer layer will occur as a result of higher adhesion force between the polymer layer and the receiving substrate relative to the adhesion force between the polymer layer and the donor substrate. This is accomplished by one or more of the following techniques: use of a thin adhesive layer between the first surfaces of the polymer layer and/or receiving layer (applied on either or both surfaces), use of a release layer between the polymer layer and the donor film, forming the mask layer from a thermally-activated (heat seal) adhesive, etc. These layers can be activated by chemical, solvent, thermal, radiation, or mechanical means. An example of a radiation-activated release is commercially available from Nitto Denko Co. of Japan. Low adhesion of the polymer layer relative to the donor substrate can also be caused by selection of a combination of polymer and substrate materials that have intrinsically weak adhesion. It is also a method of this disclosure that the polymer mask layer can also be a thermally activated polymer material such that proper heating can result in a sufficient increase in adhesion to effect the transfer.

Roll-to-Roll Semi-Dry Additive and Subtractive Processing R2R electroless (Ag, cf. Polavision) or chemical etch using gel-pad or other absorbing/neutralizing material and acidic fluid formulation.

Patterning Technique: Applied Flexmask

In certain embodiments, a 3D relief pattern as a coating template to create the polymer pattern by differential wetting either the upper or lower surfaces of the relief pattern. The polymer layer is transferred by utilizing either the adhesive properties of the polymer itself (via thermal or radiation activation) or by differential adhesion of the donor-polymer-receiver system such that the intrinsic or induced adhesion of the receiver-polymer is greater than that of the donor-polymer. Once the mask is in place on the receiving layer, the same procedures as used with the previous embodiments (additive or subtractive processing followed by mask removal) are followed to create the patterned material.

Tandem in-Line Processing

This method also discloses that the R2R pattern replication and etching processes can be carried out in a continuous vacuum operation without removal between process steps by taking advantage of in-vacuo polymer deposition and embossing, followed by plasma etching. This in-line vacuum operation can also be extended to include subsequent additive or subtractive processing. Additive processing includes deposition of metals, non-metals, transparent conductive materials, multi-layer coatings, etc. over the surface of the patterned substrate, where subsequent removal of the polymer mask layer with these vacuum-deposited overcoated layers defines the desired pattern. Subtractive processing includes the plasma etching of the material exposed by the open areas of the polymer mask.

It is an advantageous method of this disclosure that the plasma etch conditions, particularly the gas mixture, be chosen to selectively remove the underlying material at a substantially higher rate than the polymer mask. For example, oxygen plasma rapidly removes organic polymer material, such as for clearing, but not oxide layers, while subsequent replacement of the oxygen gas mixture by a methane mixture rapidly etches the oxide but not the polymer.

As previously noted, the oxide or metal layer would act as an "etch stop" for the polymer mask opening etch process. Likewise, the polymer film underlying the oxide layer would act as an etch stop for the oxide etch process. In the case of etching of similar materials, where such a high degree of specificity is not possible, it is another feature of this disclosure that the polymer mask be made sufficiently thick that the simultaneous removal of both polymer mask material and substrate material nonetheless leaves sufficient mask material in place to allow patterning. This may be assisted by the use of plasma etching conditions that favor non-isotropic etching, thereby removing horizontal material faster than vertical material.

Improved Radiation Curing

A further embodiment of this invention is the formation of ISM layers through the use of photocureable mask polymer formulations that have been made sensitive to the specific wavelength emitted by solid-state curing sources, such as LED lamps. A major advantage of using LED curing sources is that virtually all of the radiation is emitted in a narrow wavelength band that can be efficiently absorbed by the mask forming polymer liquid, with virtually no output in the infrared radiation, which can distort or damage the substrate, its constituent layers, or even the rotary template tool. By significantly reducing the heat load into the rotary tool (which also receives radiation transmitted through the substrate during the curing process, the thermal expansion/contraction cycling is virtually eliminated, thereby prolonging the life of the production (template) tools.

As a specific example, the radiation emitted from an LED, e.g., operating at 395 nm (for example as made available from (Infinilux, Inc., 1457 Glenn Curtiss, Carson, Calif. 90746, USA) can be effectively used to crosslink a polymer mask formulation by the addition of a sensitizer (e.g., as Irgacure 184 as made commercially available by Ciba Specialty Chemicals Inc., Klybeckstrasse 141, CH-4002 Basel, Switzerland) to the formulation. A further advantage of matching the crosslinking wavelength of the mask fluid to the output of a solid state diode is that the wavelength can be selected for optimal transmission through absorbing substrates and/or layers. For example, the substrate PEN (e.g., Teonex Q65A as made commercially available by DuPont Teijin Films, 1 Discovery Drive, Hopewell, Va. 23860, USA), although useful as a support film for many flexible display and electronics applications, is a strong absorber of UV radiation below ~375 nm and prevents curing through the substrate of UV adhesives that typically require this shorter wavelength. Use of diodes operating at 395 nm eliminate this problem. This can be generally used to optimize the curing of an ISM material by matching the lamp output and the polymer sensitization to a convenient transmission 'window' (spectral area of higher optical transmission) in a substrate, such for certain metal or "colored" substrates (e.g., Dupont Kapton).

LED lamps can be formed in a compact, high density arrays for maximum radiation output for faster machine run speeds. A further advantage is the ability to individually adjust the output power of various segments of the diode array to tailor the curing profile temporally and spatially. This can be accomplished by adjusting the current to each LED element or segment of the array to achieve the desired in-line ('down web") and orthogonal ("cross web") radiation intensity profile. This is useful when, for example, it is desired to allow the polymeric mask fluid in contact with the patterning tool to become uniformly distributed before the onset of curing (temporal profile) or customizing the radiation distribution depending on the characteristics of the mask pattern.

Use of solid-state LED sources for curing has the added benefit of lower cost of operation, since in a matched system the predominant radiation is efficiently used to cure the mask fluid, and wasted IR or UV radiation (and the associated air cooling and ozone handling) is eliminated.

Mask Removal

Figure 10A:
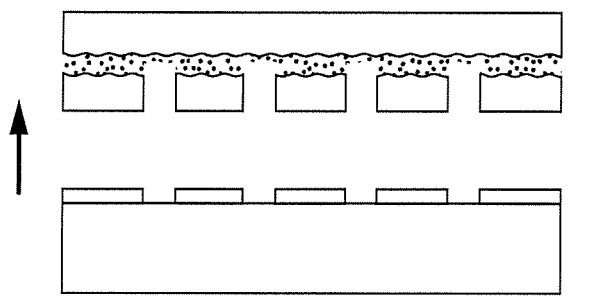
FIG. 10A-10F depict a roll-to-roll patterning method in accordance with exemplary embodiments of the present disclosure.

Exemplary embodiments of the present disclosure relate to the removal of spent ISM and can be accomplished by one or more of several techniques, e.g., as depicted in FIGS. 10A-10D. FIG. 10A shows a mechanical process for removing the used ISM layer by laminating to a pressure sensitive adhesive (PSA) on a backing roll (similar to common sticky tape). This can alternatively be a thermal adhesive, where lamination at a sufficiently elevated temperature activates the thermal layer, in turn preferentially adhering to the raised mask. Delamination removes the ISM from the underlying material layer, the adhesion to which was engineered to be low for subsequent removal.

Figure 10B:
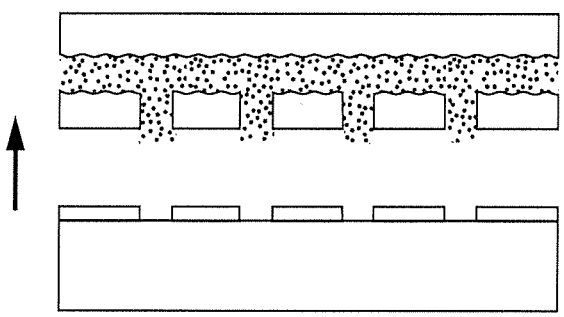

FIG. 10B. depicts another embodiment in which an adhesive, cured by either radiation, chemical reaction (e.g., epoxy, cyano-acrylate, etc.) or thermal activation, is used to adhere simultaneously to the used ISM layer and to a thin disposable film (e.g., mylar, etc.), after which it is separated from the patterned substrate and discarded. The adhesive is formulated or selected to have stronger adhesion to the ISM layer than to the desired pattern material, either by chemical interaction or due to greater adhesion to the ISM surface.

Figure 10C:
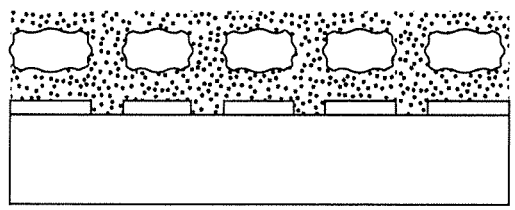
Figure 10D:
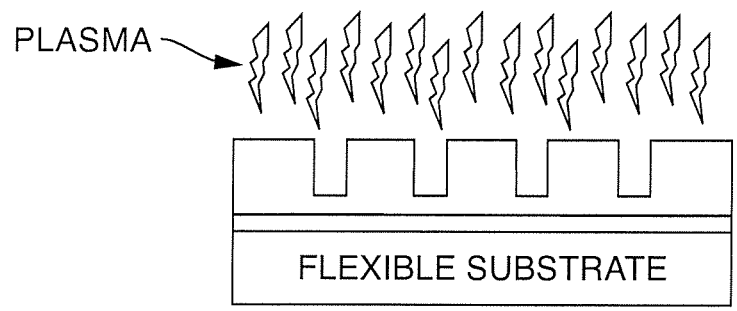

FIG. 10C depicts a schematic of the process for removal of the spent ISM layer by exposure to solvent, either in a bath or with a laminated film. The former method is carried out in a R2R process by transporting the substrate with the ISM ready for removal into a bath (FIG. 10D) containing the appropriate solvent or solvent solution. The dip tank comprises an ultrasonic vapor degreaser in which ultrasonic vibrations cause the ISM and any excess deposited material to separate from the substrate, and as the substrate is drawn up through the refluxing vapor zone the continuously condensing clean fluid continuously washes down the removed polymer mask and excess material, allowing the patterned substrate to exit clean and dry.

Figure 10E:
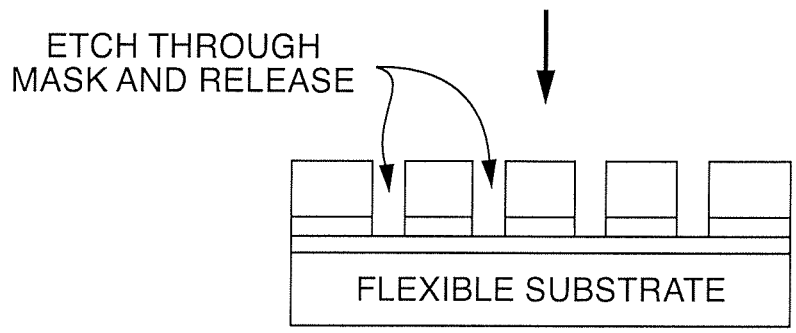

An alternative approach (e.g., as shown in FIG. 10E) can be used wherein a strip sheet is continuously laminated against the substrate and spent ISM using a solvent or solvent blend as the laminating fluid. The strip sheet keeps the solvent from evaporating until it has suitably softened the mask layer, at which time it is delaminated with the mask attached. This is accomplished either by using a layer on the strip sheet that is sufficiently softened by the solvent to cause the ISM material to adhere or by using a strip sheet that itself is softened by the solvent. The process is accelerated by the application of heat to the laminate. The strip sheet can also contain a curable layer which, when softened by the solvent, allows the spent ISM layer to press into the layer and then cured by the application of radiation, thereby capturing the ISM layer, followed by delamination to reveal the desired pattern. The strip sheet can also be patterned, such as with an array of microcups that allow a greater volume of solvent to be uniformly retained and held against the ISM layer.

Lamination to the strip sheet can be replaced by lamination to a drum, also optionally having microcups to hold additional solvent, and after separation of the patterned substrate from the drum, that section of the drum travels through a cleaning zone (or ultrasonic degreaser) in which solvents are used to clean drum before it travels back into the lamination zone.

Figure 10F:
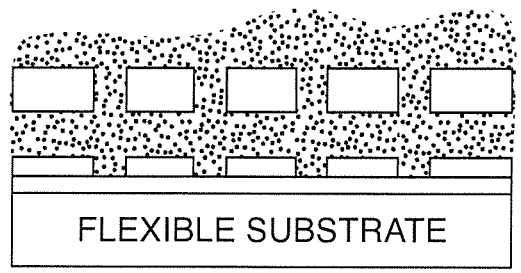

In another embodiment, a "release" layer is applied over the surface of the substrate that is to have the ISM layer. This layer is etched away after the polymer residue is removed so that it remains only under the ISM pattern during addition or removal of the desired pattern material. The release layer is selected such that it is readily dissolved by a solvent or aqueous solution (as shown in FIG. 10F), thereby increasing the ease of mask removal (during immersion or lamination mask removal step).

Use of Pre-Coated Polymer for ISM Layer

As an alternative to the process describe above of applying a polymer liquid to the rotary tool or substrate at the time of mask formation, the polymer can be pre-coated over the substrate (additive process) or metal or TCO layer (subtractive process) prior to ISM formation and the ISM formed from this layer by thermal or chemical embossing, without the addition of any other polymer.

The process of coating uniform polymer films is known in the roll manufacturing industry, such as is carried out through the use of a slot or die coating process in which the viscosity and other properties of the fluid to be coated are adjusted by the addition of diluents and other additives (wetting and leveling agents, etc.) to allow a film of the desired thickness to form after evaporation of the diluent (drying). This is a very high speed and low cost process, and can be carried out in wide widths on pre-deposited (metal or TCO) substrates, wound up and stored for use as needed. The coating process can alternatively be carried out in-line during the ISM formation step; however, the additional requirements of coating a partial or full drying add complexity to the ISM formation step and cannot take advantage of the large area, high speed coating facilities that can produce such material at lowest cost.

The pre-coated polymer layer can be formed into the ISM layer by using the same rotary tool as used in the radiation cure case, however the polymer layer must now be softened to allow molding, e.g., as described in Applicant's previously described co-owned and herein incorporated U.S. application Ser. Nos. 10/588,098, 11/509,288, 11/471,223, 11/711,928, and 11/830,718. This can be accomplished through the well-know use of heat (thermal imprinting or embossing), or in the preferred embodiment by use of chemical softening, in which a solvent for the polymer is applied to the polymer layer at the imprinting step. This latter method eliminates heating of the substrate or polymer layer (important when processing heat-sensitive materials) and also eliminates potential thermal distortion of the substrate. The preferred chemical softening agent is a solvent or solvent blend (possibly including the use of a miscible but non or weakly-reactive 'diluent' to moderate the action of the solvent) which can be applied to the polymer-coated substrate, the tool itself, or the nip (line where the rotary tool and substrate meet). Removal of the solvent leaves very little residue or contamination of the substrate or material layers.

The advantages of pre-coated ISM polymer include lower application costs, lower materials cost (no need for radiation-activated formulation), elimination of radiation sources, can work with opaque layers and tools, faster plasma etch scum removal (non-cross linked formulation), and ease of spent ISM removal (easily dissolved, with no enhancement of adhesion or crosslinking that makes removal more difficult).

Maskless Patterning

Another method of this invention to further simplify and reduce processing costs in producing patterned substrates eliminates the ISM mask formation and removal process entirely and uses direct wet etch of a pre-coated substrate using a flexible polymer template. In this method, an additive mask forming tool (having ridge-shaped protrusions corresponding to the desired lines) was formed from a 70 μm thick sheet of polycarbonate film and pressure laminated against an aluminum-coated PET substrate using acid etch solution (10% hydrochloric-nitric acid solution) and separated after 15 seconds and rinsed in water. FIG. 11 shows the resulting pattern.

In this method (see FIG. 11), the raised elements of the relief pattern were pressed in contact with the aluminum surface, preventing the etchant from contacting said area, while the non-raised areas acted as a reservoir for the etchant in direct contact with the metal surface. The process can be further optimized by the use of additives to the etch solution, including thickeners and surfactants. In addition, a compliant surface, such as elastomeric or silicone (e.g., Sylgard 184 Silicone Elastomer Base as made commercially available by Dow Corning Corporation, PO Box 994, Midland Mich. 48686, USA, and the like) can be used to form the template tool. In another embodiment, the metallized substrate is continuously fed into a nip formed by an elastomeric roll pressed against the rotary tool, while the etchant solution is added at the nip. The substrate is kept under tension and pressure to keep the protrusions tight against the metal film to prevent contact between the etch solution and the metal in those areas. The rate and extent of reaction depends on the concentration and composition of the etch solution and the height of the relief pattern. The amount of etchant ions retained in the non-raised pattern areas ("wells") must be sufficient to react with all of the metal in the contact area, otherwise the reaction will terminate when the acid ions are exhausted. Once the depth of the tool pattern and etchant concentration are set, the time of contact between the metallized film and the tool pattern is adjusted to allow the reaction to go to completion, at which time the metallized film is continuously delaminated from the rotary tool and directed into a rinse bath to stop (and neutralize) the reaction.

Metal Grids with High Transparency

Figures 12A, 12B:
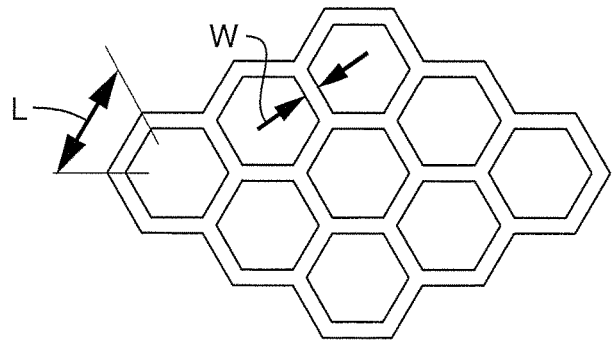
FIGS. 12A and 12B depict a high transmission grid and optical transmission of various grid patterns, respectively, in accordance with embodiments of the present disclosure.

In applications such as displays, touch screens, lighting, etc., the outer surface often requires a grid or array of electrodes that must be essentially transparent for optimum viewing. A class of materials that are commonly used for such applications are called transparent conductive oxides (TCOs), of which indium tin oxide (ITO) is the most ubiquitous. This material, however, has numerous drawbacks, particularly when used with flexible substrates, which include: high cost, difficult deposition, marginal conductivity, tendency to crack and craze, inadequate substrate adhesion, etc. Certain applications, such as organic LED (OLED) lighting, require high current densities over large areas, and ITO and other TCO do not have sufficiently low resistance to meet these needs. A preferred embodiment of this invention is the formation of high optical transmission conductive electrodes or grids by using vacuum-deposited metals having a very low ratio of metal area to surface area. This ratio can be made low enough to meet the optical transmission requirements of many such applications. The method of this invention has demonstrated the ability to form very narrow lines in a wide range of metals. Geometries such as hexagonal close packed meshes (FIG. 12A) in which the line width is made small relative to the length of the side of the "unit hexagonal cell" can have net transmissions well in excess of 90% (FIG. 12B)

The current carrying capacity of the metal grid can be further increased by several means, including increasing the aspect ratio (height relative to width), increasing the cross-sectional area which determines current carrying capacity. The grid can also be combined with a continuous transparent conductive layer (with a lower conductivity) to put material within the hexagonal cell in electrical contact with the surrounding grid. Such material could include various TCO's (ITO, indium zinc oxide, etc), polymers doped with conductive carbon nanotubes, and intrinsically conductive polymers, such as PEDOT:PSS [poly(3,4-ethylenedioxythiophene) poly-(styrenesulfonate)], etc., or various combinations thereof.

Interference Fringe Metrology

Figure 13:
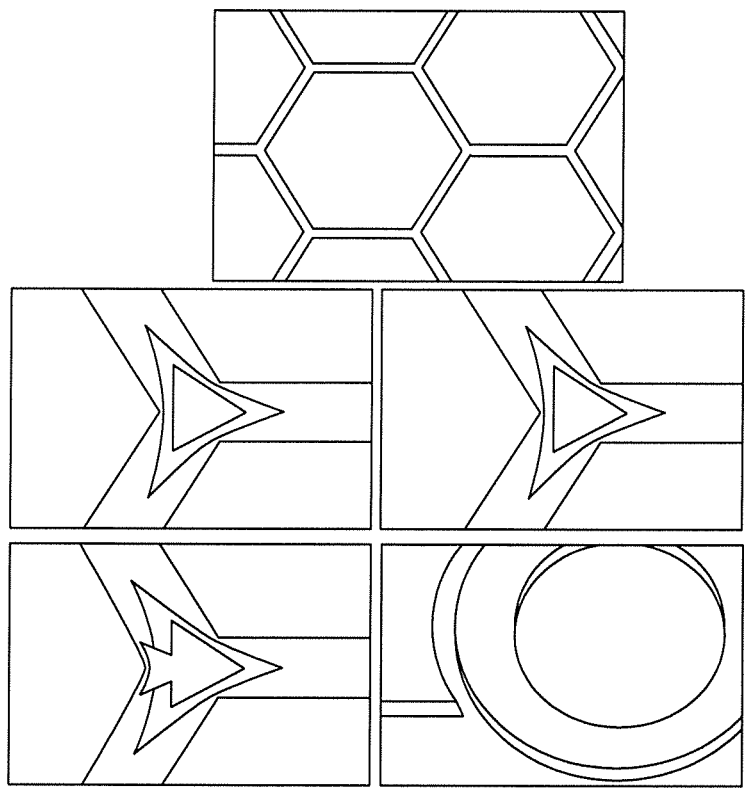
FIG. 13 depicts a composite showing the use of fringes (Moire) for metrology process and control, in accordance with exemplary embodiments of the present disclosure.

Many combinations of thin ISM residue layers and underlying thin-film layers result in the well-known phenomena of optical interference fringes (light reflected from multiple thin layers). It is a method of this invention that this can be used as a means of assessing the uniformity and thickness of the residue layers. An example is seen in FIG. 13, in which an ISM pattern of trenches (corresponding to areas in which material will be deposited in an additive process to form lines after mask removal) is formed on an ITO layer deposited on PET (e.g., 7 mil ST-504 Coated with indium tin oxide at 100 ohms/sq as made commercially available by Techni-Met, Inc., 300 Lamberton Road, Windsor, Conn. 06095: SP-7013-100-5). It can be seen that a highly colored interference fringe pattern, corresponding to thickness variations in the residual ISM polymer, is very well formed and uniform, despite the random sampling of various areas. The fringes can be seen over large areas with the unaided eye (or low magnification loop, etc.), or further enhanced using polarized light microscopy. It is a method of this disclosure that the fringe pattern (when calibrated for a given pattern, as different geometries will produce different fringe patterns) can be used as a measure of the uniformity of the polymer mask. Thus for example a CCD camera can obtain still samples by stroboscopic illumination of the moving substrate as it exits the ISM formation zone (i.e., after delamination from the rotary template tool). Analysis of the fringe pattern, using well-know machine vision hardware and algorithms, can indicate uniformity variations. Calibrating the fringe pattern as a function of process variables (e.g., nip roller pressure, polymer thickness variation, etc.) can reveal near real time process information and help to control the R2R mask formation process.

For visual inspection (or with the aid on a magnifying lens or Fresnel sheet), under most lighting conditions, including most tungsten or halogen or LED lighting, no fringes were visible; however, it was surprisingly discovered that certain types fluorescent lamps dramatically enhanced the visibility and contrast of the fringes (e.g., Philips F32T8/Cool White Alto and n:vision EDXO series), allowing rapid assessment of the residue thickness, cross web variations, etc.

The methods described herein enable the formation of patterns from a wide range of materials, on a wide range of substrates, and with very good resolution and edge acuity (sharpness). Some examples are described below:

Example of In Situ Mask (ISM) Formation

FIGS. 14A & 14B show ISM patterns formed by LED exposure, as described above, before etching. FIG. 14A shows an ISM made for subtractive processing (exposed material to be removed), and FIG. 14B shows an ISM made for additive processing (material to be deposited). The pattern comprises a series of hexagonal mesh patterns and interconnecting bus lines, where line widths of the hexagons in all cases are 20 μm. Three hexagon sizes have side lengths of 125 μm, 250 μm and 500 μm.

Example of Subtractive Plasma Process with Transparent Conductive Oxide

In FIG. 15A, the methods of this invention are used to produce a conductive transparent electrode pattern on a flexible substrate. This was carried out by first converting a test pattern design into a rotary production tool, using techniques e.g., as described in Applicant's previously described co-owned and herein incorporated U.S. application Ser. Nos. 10/588,098, 11/509,288, 11/471,223, 11/711, 928, and 11/830,718, and using the tool to continuously form an ISM layer on a substrate comprised of a 200 nm thick coating of indium tin oxide (ITO) on a flexible support film (Dupont mylar, 5 mils thick), supplied by TechniMet Inc (7 mil ST-504 Coated with Indium Tin Oxide at 100 ohms/sq. as made commercially available by Techni-Met, Inc., 300 Lamberton Road, Windsor, Conn. 06095: SP-7013-100-5:). The mask material was cured by an LED diode array emitting at 395 nm consisting of 18 individual diodes. The residual polymer at the bottoms of the ISM layer was selectively removed by plasma etching (as is known in the art), using a gas mixture of oxygen and argon in an inductively coupled plasma (ICP) mode in less than 120 sec. The ITO areas exposed through the ISM were then removed by plasma etching by changing the gas mixture to one that selectively removed ITO. The remaining ISM was left in place for these images.

Example of Subtractive Plasma Processing of Metal

FIG. 15B shows a similar process as FIG. 15A, where this time the substrate (Dupont Mylar) was first coated with Ti metal in a vacuum sputtering machine (commercially available and the ISM similarly formed. The residual layer was plasma etched, as was the Ti, using a different plasma gas mixture.

Examples of Subtractive Wet Processing of Metal

Figure 15D:
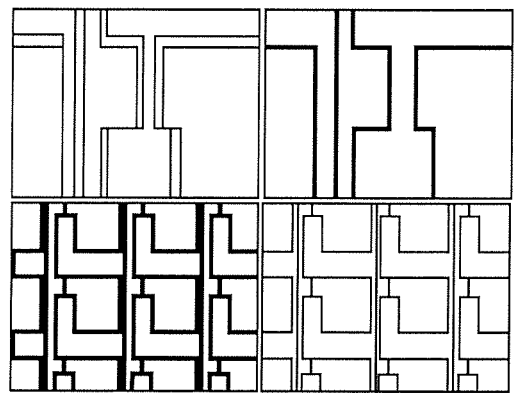

FIG. 15C shows a similar process to FIG. 15B, where the plasma etch of Ti is replaced by a wet chemical etch using a dilute solution of mineral acid (e.g., 2% hydrochloric and nitric acids), although other acid formulations will also work. FIG. 15D shows the same wet processing, but this time on a thick (1.2 μm) magnetic metal alloy (CoNbZr) coated on 8 μm thick Kapton. Due to the opacity of the alloy layer, in this example the ISM layer was formed by exposure through a transparent pattern tool. This example also demonstrates the ability to pattern very thick (1.2 μm) layers without significant over-etching (removal of the metal lines by etching under the ISM layer) and to be able to process very thin (8 μm) substrates.

Figure 15E:
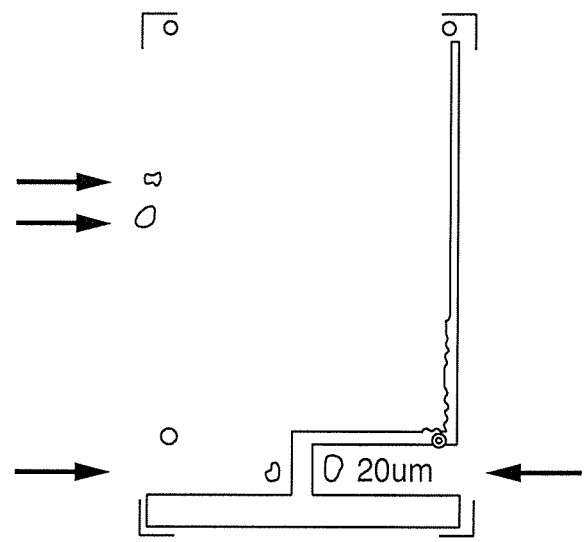

FIG. 15E shows a whole-field image (taken by digital scanner) of an aluminum pattern made by subtractive wet processing and exposure through a transparent tool.

Example of Additive Processing

Figure 16:
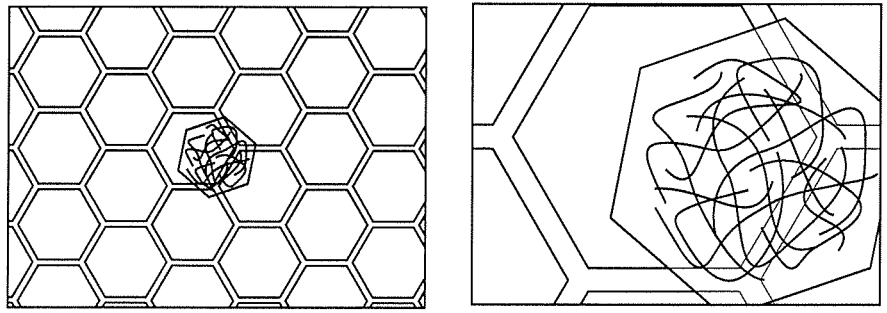
FIG. 16 includes two views of optical micrographs of gold after liftoff and (inadvertent) redeposition, in accordance with exemplary embodiments of the present disclosure.

FIG. 16 depicts an additive process in which the ISM was formed on a PEN substrate (Teonex Q65A as made commercially available by DuPont Teijin Films, 1 Discovery Drive, Hopewell, Va. 23860, USA) using the 395 nm LED light source with exposure through the substrate. After the residual polymer layer was removed by plasma etching, a layer of gold was deposited by sputtering (known art) over the entire surface, then the sample immersed in a solvent which was chosen to cause the ISM polymer to swell (methylene chloride, as one example), thereby causing the ISM and excess gold to lift off. The optical micrograph includes an instructive section in which the lifted-off polymer was inadvertently re-deposited due to incomplete rinsing.

Example of Pattern with High Resolution

Figure 17:
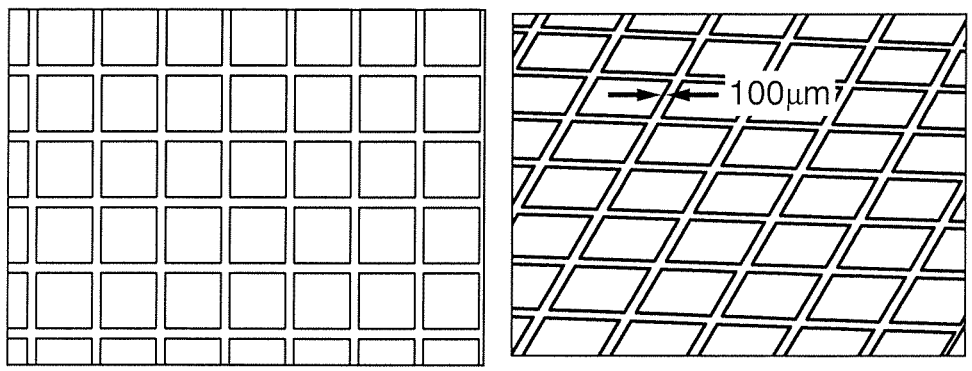
FIG. 17 includes two views of SEM optical micrographs of Ti wire loops made by subtractive process (each loop is 3.5 μm on side and 100 in width), in accordance with exemplary embodiments of the present disclosure.

FIG. 17 depicts a scanning electron microscope ("SEM") image of an array of square-loop wires on PET made of Ti metal. Essentially the same conditions as FIG. 15B were used to form this pattern. The individual lines are approximately 100 nm wide and the square loop side dimension is 3.5 μm.

Figure 18A:
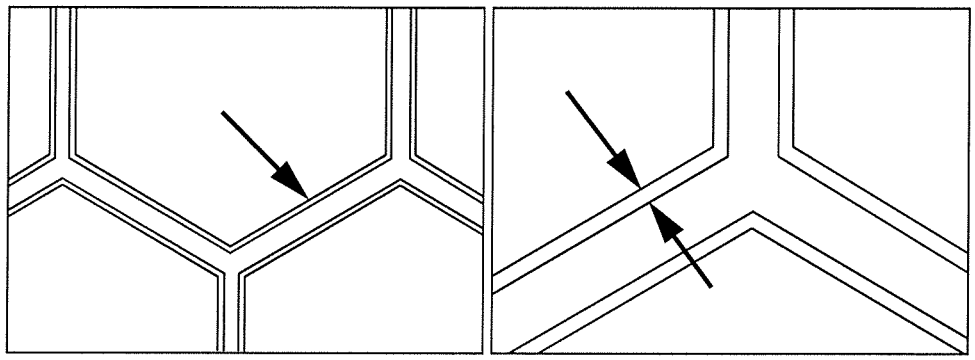
FIGS. 18A-18B depict micrographs of etched layers of different materials, in accordance with exemplary embodiments of the present disclosure.
Figure 18B:
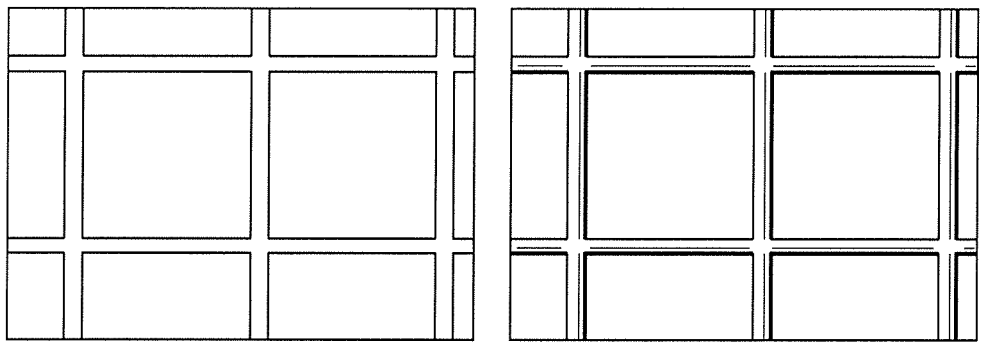

Another embodiment of this invention is the use of controlled over-etching to achieve thinner pattern features without significantly sacrificing width uniformity, thereby allowing higher resolution patterning from a less expensive template (for example where graphic arts printing, mechanical scribing, etc. or other inexpensive techniques are used to form the master template). An example of this is seen in FIG. 18A, where an extended contact time with the etch solution has caused the aluminum lines to become uniformly etched under the ISM. FIG. 18B compares the original mask width (SEM on left) to metal alloy lines after extended wet etch has further uniformly reduced the line width.

Example of Low Residue (Scum) Processing

Figure 19:
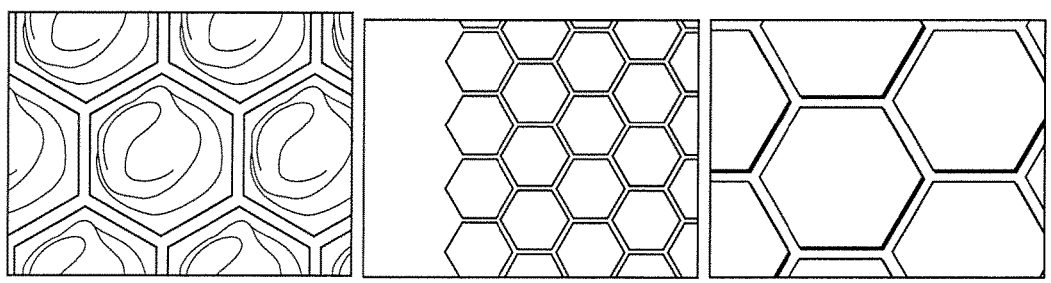
FIG. 19 depicts micrographs of reduced polymer residue results, in accordance with exemplary embodiments of the present disclosure.

FIG. 19 shows several examples of low residue processing in which a solvent (acetone) was added in amounts ranging from 5% to 15% by volume to a radiation cured acrylic polymer sensitized to 395 nm radiation. On the left image the residue polymer (colored fringes) can be seen de-wetted (retracted) from the side perimeter areas on an aluminum coated substrate, and the center and right image with show similar effects on an ITO-coated substrate.

SUMMARY

Accordingly, embodiments of the present disclosure may provide one or more of the following benefits and advantages. The continuous roll-to-roll patterning methods/processes according to the present disclosure can provide manufacturing process improvements needed to overcome the drawbacks associated with various present approaches. The process can be carried out at near room temperature and with minimal pressure, and can produce pattern features over a wide range of sizes (nanometer to millimeter). The process can be carried out with no exposure to aqueous ionic developing/stripping solutions. Thus the processing conditions can configured as necessary to minimize the effects of physical or thermal damage or chemical contamination to sensitive underlying features, structures, and substrates. Furthermore, the drum technology used in this process can produce near seamless, or true seamless patterns as necessary. Additionally, lateral features formed in the mask or final formed desired pattern on a flexible substrate may be achieved that are on a very small scale, e.g., 1, 10, 50, 100+ nanometers.

Additionally, in certain embodiments, the wavelength of a radiation source and the transmission wavelength of the substrate and the wavelength sensitivity of the fluid may be matched or closely matched. For example, a radiation source having narrow wavelength output (=narrow band), such as laser or LED, may be used to solidify the fluid used, where the fluid is made sensitive to such a wavelength. This has the advantage of supplying energy that predominately only contributes to the curing (solidification) and does not emit excess radiation that can damage the material or tools. As a specific example, a blue LED (singly or in an array) is used to cure blue-sensitive monomer formulation (fluid), without generation of any significant amount of heat (a real problem with other "broad band" radiation sources). Although lasers have similar output characteristics, they generally require scanning or sweeping to cover a large area, are relatively expensive. Blue LEDs are cheap, cover a broad physical (curing) area, do not produce heat that could distort the substrate or other materials in the pattern layer, or cause heat damage to rotary tools. In such a related particular R2R process, it may also be an advantage to wrap the substrate around at least part of the circumference of the drum tool in order to prolong exposure to radiation while mask layer is in contact with the drum pattern tool (more complete cure, can run film faster). Such would additionally allow control of lamination force (of one film layer to another) by controlling substrate tension while wrapped around drum (typically up to ¾ or so of the circumference can be used for wrapping). Similarly: a substrate having a mask pattern layer may be laminated against a strip sheet using for the lamination fluid either an etch fluid or chemical reagent mixture (that can deposit a metal or other material). Wrapping this around part of the outer circumference of a heated drum can accelerate the etch or the deposition reaction. Strip sheet is peeled off afterwards. In further embodiments, a strip sheet may contain a layer to absorb and/or neutralize excess reagents, so excess materials are carried away upon delamination.

Further, patterning methods according to this disclosure can also offer several major advantages over another common patterning technique used for larger patterns, that of metallic shadow (stencil) masks. The in situ polymer patterning method described herein, being "single use," does not change critical dimensions or degrade with use, as do stencil-type shadow masks used for etching or vacuum deposition patterning. Additionally, the polymer mask is in intimate contact with the substrate, thereby eliminating indistinct or fuzzy edges that can result for improper stencil mask contact. Another benefit relative to shadow masks is that certain geometric patterns cannot be made with stencil technology (such as a free-standing circle in the center of an "O", etc.), which is not a limitation with the methods of this disclosure. A particular benefit of this technology over masks produced by screen, gravure, or other printing techniques (including ink jet, etc.) is that much higher resolution is possible, with mask patterns in the nanometer regime being possible.

Accordingly, while certain embodiments have been described herein, it will be understood by one skilled in the art that the methods, systems, and apparatus of the present disclosure may be embodied in other specific forms without departing from the spirit thereof. The present embodiments are therefore to be considered in all respects as illustrative and not restrictive, and Applicant intends to claim all changes that come within the meaning and range of equivalency of the embodiments described herein.

What is claimed is:

1. A method for forming a desired material pattern on a flexible material substrate in a continuous roll-to-roll process, the method comprising:
   a. forming an overlying polymeric layer, overlaying the flexible material substrate;
   b. in a continuous roll-to-roll process continuously forming a three-dimensional (3-D) relief pattern in the overlying polymeric layer using a rotary-shaped template surface including a complementary 3-D relief pattern, thereby forming a polymeric mask layer overlaying the flexible material substrate;
   c. continuously removing residual polymer from an underside of the relief pattern in the overlying polymeric mask layer to expose the flexible material substrate through openings in the overlying patterned polymeric mask layer;
   d. continuously depositing a new material layer over the polymeric mask layer and the flexible material substrate exposed through the openings in the polymeric mask layer; and
   e. continuously removing by a roll-to-roll process the polymeric mask layer and excess new material deposited on upper surfaces of the mask layer from the underlying flexible material substrate, thereby revealing the desired material pattern on the flexible material substrate.

2. The method of claim 1, wherein continuous roll plasma etching is used to remove residual polymer from an underside of the relief pattern.

3. The method of claim 1, wherein chemical exposure is used to remove residual polymer from an underside of the relief pattern.

4. The method of claim 1, wherein an adhesion of the polymeric layer to the underlying upper material layer is controlled by de-wetting during formation of the relief pattern to expose the flexible material substrate through the openings in the overlying polymeric mask layer.

5. The method of claim 1, wherein continuous roll vacuum deposition is used to deposit the new material layer.

6. The method of claim 1, wherein physical or chemical or electrochemical deposition is used to deposit the new material layer.

7. The method of claim 1, wherein the new material layer is a metal or alloy or transparent conductive material or oxide or inorganic material.

8. The method of claim 1, wherein the overlying polymeric layer is formulated to be crosslinked by radiation transmitted through interposed substrate and material layers.

9. The method of claim 1, wherein the polymeric mask layer is formed by exposure of the polymeric layer on the flexible material substrate to a solvent or mixture of solvents and/or diluents capable of softening the polymeric layer prior to contact with the rotary-shaped template surface.

\* \* \* \* \*